(12) United States Patent
Beyer et al.

(10) Patent No.: US 10,084,057 B2
(45) Date of Patent: Sep. 25, 2018

(54) NVM DEVICE IN SOI TECHNOLOGY AND METHOD OF FABRICATING AN ACCORDING DEVICE

(71) Applicant: GLOBALFOUNDRIES Inc., Grand Cayman (KY)

(72) Inventors: Sven Beyer, Dresden (DE); Martin Trentzsch, Radebeul (DE); Stefan Flachowsky, Dresden (DE); Axel Henke, Medingen (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 150 days.

(21) Appl. No.: 15/237,794

(22) Filed: Aug. 16, 2016

(65) Prior Publication Data

US 2018/0053832 A1   Feb. 22, 2018

(51) Int. Cl.
| | | |
|---|---|---|
| *H03K 3/01* | (2006.01) | |
| *H01L 29/51* | (2006.01) | |
| *H01L 21/02* | (2006.01) | |
| *H01L 21/84* | (2006.01) | |
| *H01L 27/12* | (2006.01) | |
| *H01L 29/06* | (2006.01) | |

(52) U.S. Cl.
CPC ........ *H01L 29/516* (2013.01); *H01L 21/0228* (2013.01); *H01L 21/02266* (2013.01); *H01L 21/84* (2013.01); *H01L 27/1203* (2013.01); *H01L 29/0642* (2013.01); *H01L 29/517* (2013.01)

(58) Field of Classification Search
CPC ............. H01L 29/78391; H01L 29/516; H01L 29/6684; H01L 21/28291; H01L 2924/00
See application file for complete search history.

(56) References Cited

U.S. PATENT DOCUMENTS

| | | | | |
|---|---|---|---|---|
| 8,564,040 | B1 * | 10/2013 | Doris ................ | H01L 29/66174 257/312 |
| 2001/0012698 | A1 * | 8/2001 | Hayashi ............ | H01L 21/31691 438/782 |
| 2006/0099722 | A1 * | 5/2006 | Mitsui ..................... | H01L 28/57 438/3 |
| 2014/0153312 | A1 * | 6/2014 | Sandhu ................... | G11C 11/22 365/145 |
| 2015/0311349 | A1 * | 10/2015 | Ramaswamy ...... | H01L 27/1159 257/295 |
| 2016/0118404 | A1 * | 4/2016 | Peng ................. | H01L 27/11597 257/295 |

* cited by examiner

*Primary Examiner* — Sibin Chen
(74) *Attorney, Agent, or Firm* — Amerson Law Firm, PLLC

(57) ABSTRACT

The present disclosure provides in one aspect a semiconductor device including a substrate structure comprising an active semiconductor material formed over a base substrate and a buried insulating material formed between the active semiconductor material and the base substrate, a ferroelectric gate structure disposed over the active semiconductor material in an active region of the substrate structure, the ferroelectric gate structure comprising a gate electrode and a ferroelectric material layer, and a contact region formed in the base substrate under the ferroelectric gate structure.

18 Claims, 19 Drawing Sheets

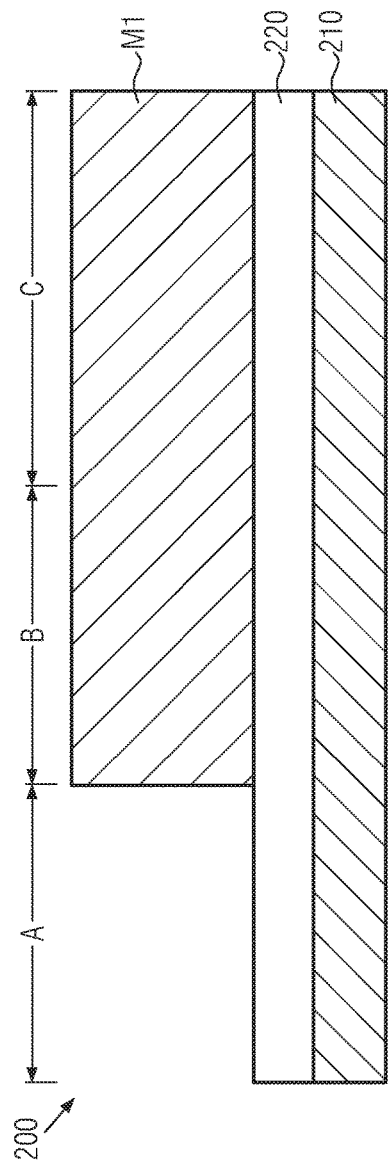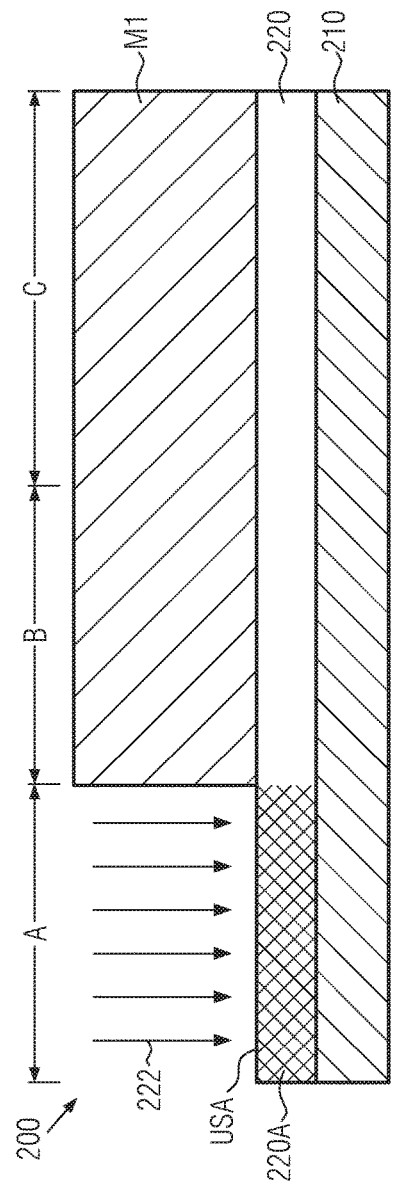

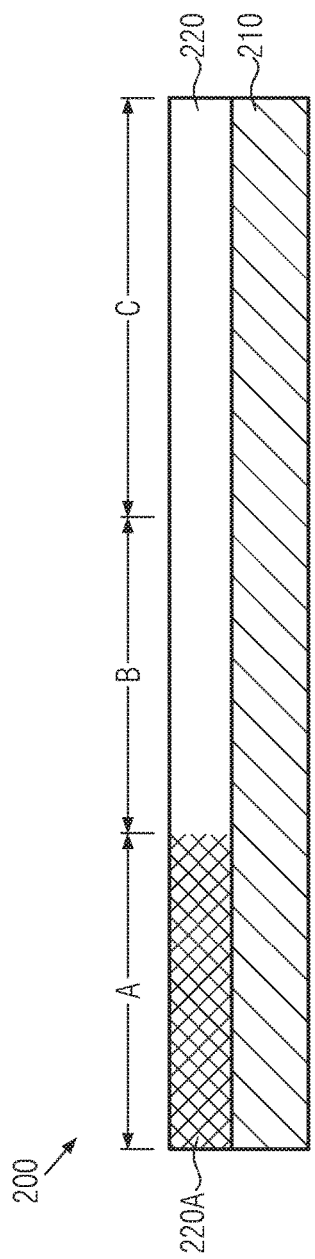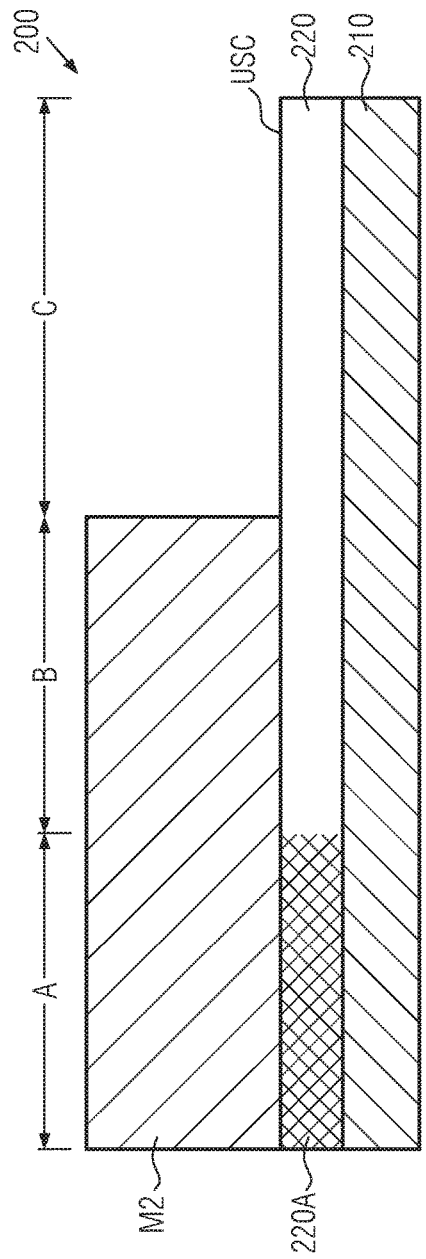

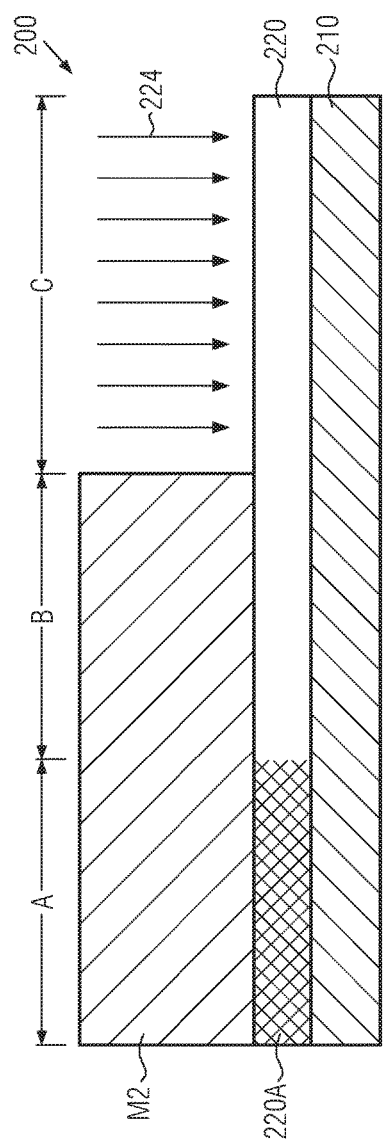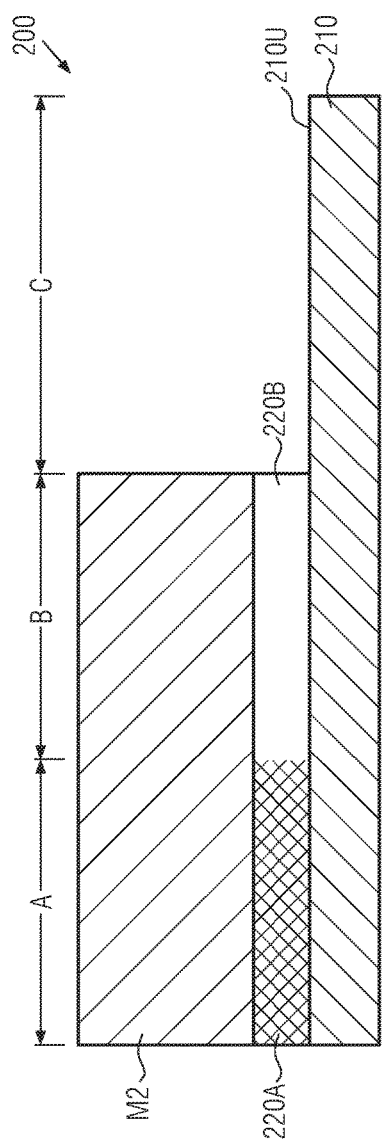

NVM DEVICE IN SOI TECHNOLOGY AND METHOD OF FABRICATING AN ACCORDING DEVICE

BACKGROUND OF THE INVENTION

1. Field of the Invention

The present disclosure generally relates to semiconductor devices and methods, and, more particularly, to non-volatile memory devices in SOI technologies and methods of fabricating according devices.

2. Description of the Related Art

In modern electronic equipment, integrated circuits (ICs) experience a vast applicability in a continuously spreading range of applications. Particularly, the demand for increasing mobility of electronic devices at high performance and low energy consumption drives developments to more and more compact devices having features with sizes ranging even into the deep sub-micron regime; the more so as current semiconductor technologies are apt of producing structures with dimensions in the magnitude of 10 nm. With ICs representing a set of electronic circuit elements integrated on a semiconductor material, normally silicon, ICs can be made much smaller than discreet circuits composed of independent circuit components. The majority of present-day ICs are implemented by using a plurality of circuit elements, such as field effect transistors (FETs), also called metal oxide semiconductor field effect transistors (MOSFETs or simply MOS transistors), and passive elements, such as resistors and capacitors, integrated on a semiconductor substrate with a given surface area. Typically, present-day integrated circuits involve millions of single circuit elements formed on a semiconductor substrate.

The basic function of a FET or a MOSFET is that of an electronic switching element, wherein a current through a channel region between two contact regions, referred to as source and drain, is controlled by a gate electrode, which is disposed over the channel region and to which a voltage relative to source and drain is applied. Particularly, in applying a voltage exceeding a characteristic voltage level to the gate electrode, the conductivity state of a MOSFET is changed and the characteristic voltage level, usually called "threshold voltage" and in the following referred to as Vt, characterizes the switching behavior of a MOSFET. In general, Vt depends nontrivially on the transistor's properties, e.g., materials, dimensions, etc., such that the implementation of a desired Vt involves plural steps of adjustment and fine-tuning during the fabrication process.

With the continuous scaling down to increasingly small technology nodes in the deep sub-micron regime (at present at 22 nm and beyond), various issues and challenges arise. For example, a precise control of the electrical conductivity of the channel of a MOS transistor is difficult to maintain at very small process geometries. Since the switching behavior of a MOSFET is characterized by the threshold voltage Vt of a MOSFET, the precise setting of a definition and control of the threshold Vt throughout the fabrication process of semiconductor devices is essential for achieving optimal power consumption and performance of semiconductor device structures. In general, there are several factors which control the threshold voltage VT, such as the gate oxide thickness, the work function of the gate, and the channel doping, mainly representing independent factors. The scaling of a semiconductor device to more advanced technology nodes led to faster switching and higher current drive behaviors for advanced semiconductor devices, at the expense, however, of a decreased noise margin, increased leakage current and increased power.

Currently, the most common digital integrated circuits built today use CMOS technology, which is fast and offers a high circuit density and low power per gate. CMOS devices or "complementary symmetry metal oxide semiconductor" devices, as sometimes referred to, make use of complementary and symmetrical pairs of P-type and N-type MOSFETs. Two important characteristics of CMOS devices are the high noise immunity and low static power consumption of a CMOS device because the series combination of complementary MOSFETs in a CMOS device draws significant power only momentarily during switching between on- and off-states, since one transistor of a CMOS device is always in the off-state. Consequently, CMOS devices do not produce as much waste heat as other forms of semiconductor devices, for example, transistor-transistor logic (TTL) or NMOS logic devices, which normally have some standing current even when not changing state. In current CMOS technologies, standard transistors and IO devices have the same high-k dielectric and metal electrode, whereas, in comparison with standard devices, the $SiO_2$ oxide of IO devices is thicker.

Digital electronic circuits are usually made from large assemblies of logic gates. Memory is a key element of digital electronic circuits as the output of a digital electronic circuit often depends not only on the present value of the inputs to the digital electronic circuit, but also on the circuit's previous state. Memory devices may be distinguished by non-volatile memory (NVM) and volatile memory devices. Volatile memory devices, as opposed to NVM devices, require constant power to maintain the stored information and are often implemented in the form of dynamic random access memory (DRAM) or static random access memory (SRAM) devices. By contrast, NVM devices retain the stored information even when not constantly supplied with electric power. Accordingly, NVM devices are suitable for long-term storage of information and, therefore, are important to mobile electronic circuits. An example of an electronic non-volatile computer storage medium is given by flash memory, which was originally developed from electrically erasable programmable read only memory (EEPROM). In a more recent application, flash memories are used as a replacement for hard discs. Since flash memory does not have the mechanical limitations and latencies of hard drives, flash-based drives are attractive when considering speed, noise, power consumption and reliability of hard drives. Accordingly, flash drives are gaining in popularity as mobile devices, secondary storage devices and as substitutes for hard drives in high performance desktop computers.

Currently, non-volatile and reconfigurable field programmable gate arrays (FPGAs) are considered as representing an attractive solution for high level system integration in various applications, such as aerospace and military applications. Unlike SRAM-based FPGAs, the configuration memories are not volatile and, hence, do not require additional NVM to reload the device configuration data at system power-up or due to radiation effects, in addition to triple module redundancy (TMR) of its entire set of configuration bits.

In efforts to improve memory arrays, field effect transistors with ferroelectric gates (FeFETs) have been recently in the focus of research. In general, ferroelectric materials have dielectric crystals which show a spontaneous electric polarization similar to ferromagnetic materials showing a spontaneous magnetization. Upon applying an appropriate external electric field to a ferroelectric material, the direction of polarization can be reoriented. The basic idea is to use the direction of spontaneous polarization in ferroelectric memories for storing digital bits. In FeFETs, the effect that one makes use of is the possibility to adjust the polarization state of a ferroelectric material on the basis of appropriate electrical fields which are applied to the ferroelectric material which, in a FeFET, is usually the gate oxide. Since the polarization state of a ferroelectric material is preserved unless it is exposed to a high, with regard to the polarization state, counter-oriented electrical field or a high temperature, it is possible to "program" a capacitor formed of ferroelectric material such that an induced polarization state reflects an information unit. Therefore, an induced polarization state is preserved, even upon removing an accordingly "programmed" device from a power supply. In this way, FeFETs allow the implementation of non-volatile electrically-switchable data storage devices.

On the basis of ferroelectric materials, it is possible to provide non-volatile memory devices, particularly random-access memory devices similar in construction to DRAM devices, but differing in using a ferroelectric layer instead of a dielectric layer such that non-volatility is achieved. For example, the 1T-1C storage cell design in a FeRAM is similar in construction to the storage cell in widely used DRAM in that both cell types include one capacitor and one access transistor—a linear dielectric is used in a DRAM cell capacitor, whereas, in a FeRAM cell capacitor, the dielectric structure includes a ferroelectric material. Other types of FeRAMs are realized as 1T storage cells which consist of a single FeFET employing a ferroelectric dielectric instead of the gate dielectric of common MOSFETs. The current-voltage characteristic between source and drain of a FeFET depends in general on the electric polarization of the ferroelectric dielectric, i.e., the FeFET is in the on- or off-state, depending on the orientation of the electric polarization state of the ferroelectric dielectric. Writing of a FeFET is achieved in applying a writing voltage to the gate relative to source, while a 1T-FeRAM is read out by measuring the current upon applying a voltage to source and drain. It is noted that reading out of a 1T-FeRAM is non-destructive.

Though a FeFET or a ferroelectric capacitor represent in theory very promising concepts for complex semiconductor devices, it is a difficult task to identify appropriate ferroelectric materials which are compatible with existing advanced manufacturing processes of complex devices, particularly at very small scales. For example, commonly-known ferroelectric materials, such as PZT or perovskites, are not compatible with standard CMOS processes. According to present understanding, hafnium (Hf) materials which are used in current fabrication technologies exhibit a paraelectric behavior due to the predominantly monoclinic crystal structure present in $HfO_2$. However, recent research results indicate that dielectric materials on the basis of hafnium oxide may represent promising candidates for materials with ferroelectric behavior to be used in the fabrication of ferroelectric semiconductor devices of ICs. For example, it was shown that the monoclinic structure may be suppressed in Zr, Si, Y and Al-doped hafnium oxide materials and stabilized crystal structures of ferroelectric nature were obtained in experiments with accordingly-doped samples, wherein such doped hafnium oxide materials are deposited by atomic layer deposition (ALD), chemical vapor deposition (CVD) or the like, using an appropriate precursor for implementing the desired doping. In any case, a TiN liner is to be formed on the deposited hafnium oxide material in order to stabilize the ferroelectric phase during subsequent processing.

In accordance with known process flows for fabricating embedded non-volatile memory devices via FeFETs, the ferroelectric material is deposited during gate stack formation in front end of line (FEOL) processes, in parallel to standard logic and IO devices. Particularly, three different types of gate stacks are to be formed in parallel when employing CMOS technology processes at advanced technology nodes when forming embedded NVM devices. The difficulty here is to form appropriate gate dielectrics for IO devices, FeFET devices and logic devices in parallel, because the gate dielectric of IO and FeFET devices, for example, requires a comparatively thick gate dielectric when compared to the gate dielectric of logic devices. Furthermore, the gate dielectric of FeFET devices needs to be ferroelectric and, therefore, a ferroelectric high-k material needs to be used in the gate dielectrics.

In view of the above explanations, it may be desirable to improve existing implementations of embedded NVM devices into CMOS technology in an efficient way without rendering known process flows too complex.

It is, therefore, desirable to control the threshold voltage VT of advanced semiconductor devices at advanced technology nodes, and to provide semiconductor device structures that allow for adjustment and tuning of the threshold voltage VT, particularly in flash memory technologies.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In a first aspect of the present disclosure, a semiconductor device is provided. In accordance with some illustrative embodiments herein, the semiconductor device comprises a substrate structure comprising an active semiconductor material formed over a base substrate, and a buried insulating material formed between the active semiconductor material and the base substrate, a ferroelectric gate structure disposed over the active semiconductor material in an active region of the substrate structure, the ferroelectric gate structure comprising a gate electrode and a ferroelectric material layer, and a contact region formed in the base substrate under the ferroelectric gate structure.

In a second aspect of the present disclosure, a method is provided. In accordance with some illustrative embodiments herein, the method includes forming a ferroelectric gate structure over an active region of a substrate structure, the substrate structure comprising an active semiconductor material formed over a base substrate, and a buried insulating material formed between the active semiconductor material and the base substrate, and forming a contact region in the base substrate under the ferroelectric gate structure, wherein the ferroelectric gate structure comprises a gate electrode and a ferroelectric material layer.

In a third aspect of the present disclosure, a method of operating a semiconductor device is provided, wherein the semiconductor device includes a substrate structure comprising an active semiconductor material formed over a base substrate and a buried insulating material formed between the active semiconductor material and the base substrate, a ferroelectric gate structure disposed over the active semiconductor material in an active region of the substrate structure, the ferroelectric gate structure comprising a gate electrode and a ferroelectric material layer, source/drain regions formed in the active region in alignment with the ferroelectric gate structure, and a contact region formed in the base substrate under the ferroelectric gate structure. In accordance with some illustrative embodiments herein, the method includes applying a reference voltage level Vref to the source/drain regions and exposing the ferroelectric material layer to an access voltage drop V1. Herein, exposing the ferroelectric material to the access voltage V1 comprises applying a gate voltage level V2>Vref to the gate electrode and applying a back bias voltage level V3<Vref to the contact region, wherein V1=abs(V2)+abs(V3).

BRIEF DESCRIPTION OF THE DRAWINGS

The disclosure may be understood by reference to the following description taken in conjunction with the accompanying drawings, in which like reference numerals identify like elements, and in which:

FIGS. 2a-2j schematically illustrate formation of a ferroelectric gate structure in accordance with some illustrative embodiments of the present disclosure;

Figure 1:
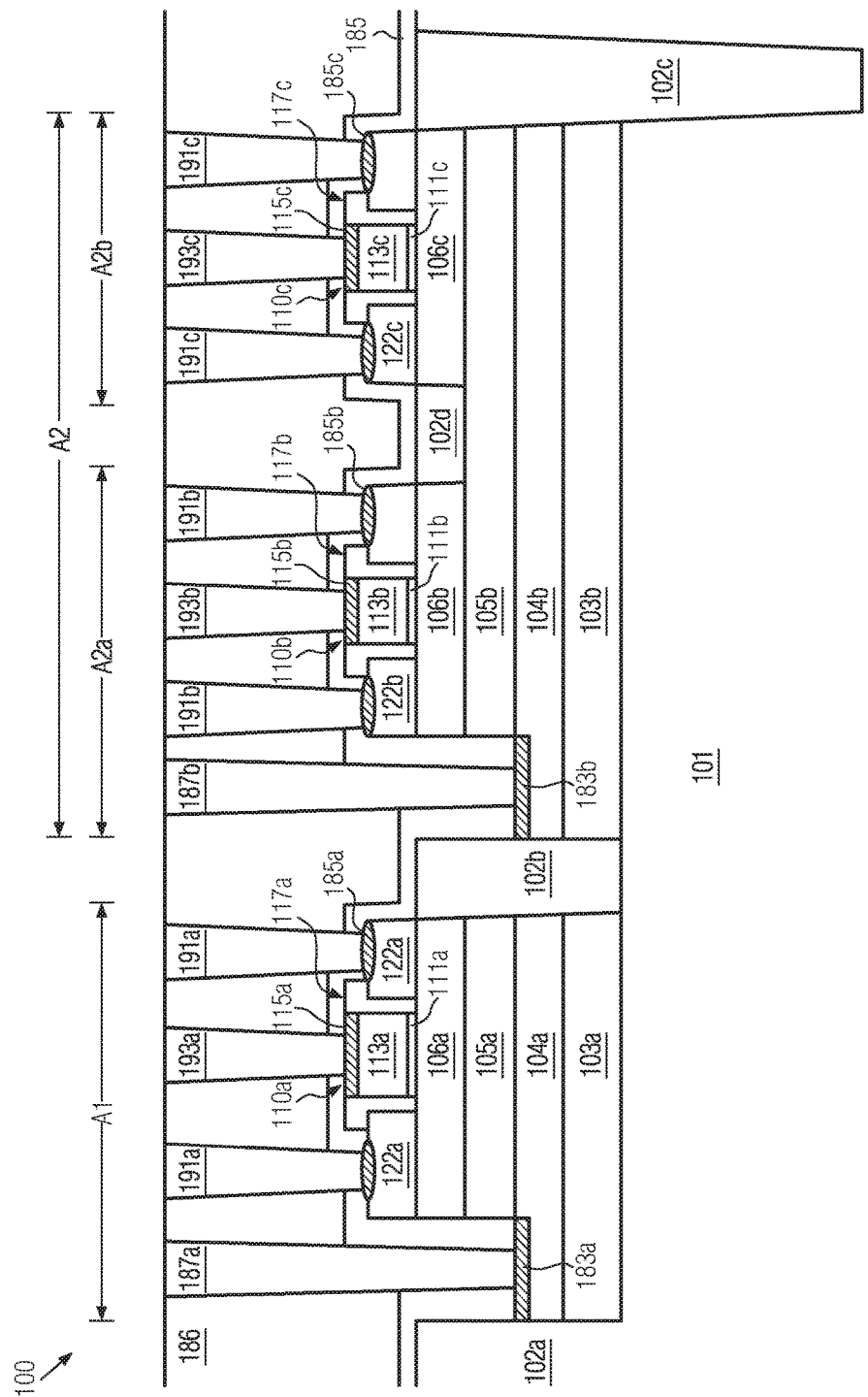
FIG. 1 schematically illustrates a semiconductor device in accordance with some illustrative embodiments of the present disclosure.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

The present disclosure relates to a method of forming a semiconductor device and to semiconductor devices, wherein the semiconductor devices are integrated on or in a chip. In accordance with some illustrative embodiments of the present disclosure, the semiconductor devices may substantially represent FETs, e.g., MOSFETs or MOS devices. When referring to MOS devices, the person skilled in the art will appreciate that, although the expression "MOS device" is used, no limitation to a metal-containing gate material and/or to an oxide-containing gate dielectric material is intended.

Semiconductor devices of the present disclosure concern devices which may be fabricated by using advanced technologies, i.e., the semiconductor devices may be fabricated by technologies applied to approach technology nodes smaller than 100 nm, for example, smaller than 50 nm or smaller than 35 nm, e.g., at 22 nm or below. After a complete review of the present application, the person skilled in the art will appreciate that, according to the present disclosure, ground rules smaller or equal to 45 nm, e.g., at 22 nm or below, may be imposed but that the present invention is not limited to such examples. After a complete review of the present application, the person skilled in the art will also appreciate that the present disclosure may be employed in fabricating semiconductor devices with structures of minimal length dimensions and/or width dimensions smaller than 100 nm, for example, smaller than 50 nm or smaller than 35 nm or smaller than 22 nm. For example, the present disclosure may provide semiconductor devices fabricated by using 45 nm technologies or below, e.g., 22 nm or even below.

The person skilled in the art will appreciate that semiconductor devices may be fabricated as P-channel MOS transistors or PMOS transistors and N-channel transistors or NMOS transistors; both types of transistors may be fabricated with or without mobility-enhancing stressor features or strain-inducing features. It is noted that a circuit designer can mix and match device types, using PMOS and NMOS devices, stressed and unstressed, to take advantage of the best characteristics of each device type as they best suit the semiconductor device under design.

In accordance with some illustrative embodiments of the present disclosure, a semiconductor device structure may comprise at least one semiconductor device. In accordance with illustrative examples herein where a semiconductor device structure comprises two semiconductor devices, the two semiconductor devices may be separated by at least one intermediate isolation structure, e.g., a trench isolation structure (for example, a shallow trench isolation structure). In accordance with some other illustrative examples herein where a semiconductor device structure comprises three or more semiconductor devices, an isolation structure, e.g., a trench isolation structure (for example, a shallow trench isolation structure) may be disposed between two adjacent semiconductor devices.

In general, SOI devices are formed on an SOI (Semiconductor-On-Insulator) substrate that comprises an active semiconductor layer disposed on a buried insulating material layer, which, in turn, is formed on a base substrate material. In accordance with some illustrative embodiments herein, the active semiconductor layer may comprise one of silicon, germanium, silicon germanium and the like. The buried insulating material layer may comprise an insulating material, e.g., silicon oxide or silicon nitride. The base substrate material may be a base material that may be used as a substrate as known in the art, e.g., silicon and the like. After a complete review of the present application, the person skilled in the art will appreciate that, in accordance with illustrative embodiments employing FDSOI substrates, the active semiconductor layer may have a thickness of about 20 nm or less, while the buried insulating material layer may have a thickness of about 145 nm or, in accordance with advanced techniques, the buried insulating material layer may have a thickness in a range from about 10-30 nm. For example, in some special illustrative embodiments of the present disclosure, the active semiconductor layer may have a thickness of about 6-10 nm.

As to a crystallographic plane orientation of the base substrate material, similar to that of an ordinary silicon device, an SOI substrate whose surface is a face (100) may be used. However, in order to improve the performance of a PMOS semiconductor device, a surface of the PMOS semiconductor device may be used as a face (110). Alternatively, a hybrid plane orientation substrate whose surface may be mixed by a face (100) and a face (110) may be used. With regard to a varactor device, there is no restriction on a crystal plane orientation such that an impurity concentration, film thickness, dimension ratio of the device and the like can be appropriately adjusted to obtain a capacitance characteristic that is suitable according to the plane orientation set by other requirements. In alternative embodiments, the base substrate material may be of an N-type when N-accumulation and/or N-inversion devices are considered (otherwise P-type for P-accumulation and/or P-inversion).

In accordance with some illustrative embodiments of the first aspect above, the contact region may be a well region formed in the base substrate. In accordance with some illustrative examples herein, the well region may be an N-well and the base substrate may have at least one P-well region laterally enclosing the N-well.

In accordance with some illustrative embodiments of the first aspect above, the semiconductor device may further comprise a contact structure contacting said contact region. The contact structure may extend through the buried insulating material adjacent to the ferroelectric gate structure. In accordance with some illustrative examples herein, a location where the contact structure extends through the buried insulating material may be outside the active region.

In accordance with some illustrative embodiments of the first aspect above, the active region may be laterally enclosed by an isolation structure.

In accordance with some illustrative embodiments of the first aspect above, the ferroelectric material layer may be formed by a ferroelectric high-k material. In accordance with some illustrative examples herein, the ferroelectric high-k material may comprise a hafnium oxide material.

In accordance with some illustrative embodiments of the first aspect above, the ferroelectric high-k material may be $Si:HfO_2$.

In accordance with some illustrative embodiments of the second aspect above, forming the ferroelectric gate structure may comprise forming the ferroelectric material layer and forming the gate electrode over the ferroelectric material layer. In accordance with some illustrative examples herein, forming the ferroelectric material layer may comprise depositing a hafnium oxide material layer over the active region and implanting at least one of silicon (Si), zirconium (Zr), lanthanum (La), aluminum (Al) and gadolinium (Gd) into the hafnium oxide material layer. In accordance with other illustrative examples herein, forming the ferroelectric material layer may comprise depositing a hafnium oxide material layer doped with at least one of silicon (Si), zirconium (Zr), aluminum (Al), yttrium (Y), lanthanum (La) and gadolinium (Gd) by means of one of an ALD deposition process and a physical vapor deposition (PVD) deposition process over the active region, and forming a TiN layer on the deposited hafnium oxide material layer before the gate electrode is formed. In a special illustrative example, the method may further comprise an anneal step after the TiN layer is formed, the anneal step comprising applying a temperature out of a range from about 300° C. to about 1200° C.

In accordance with some illustrative embodiments of the second aspect above, an isolation structure may be formed in the substrate structure. The isolation structure may extend through the active semiconductor material and laterally enclose the active region.

In accordance with some illustrative embodiments of the second aspect above, the method may further include exposing a portion of the base substrate adjacent to the active region, wherein exposing the portion may comprise removing a portion of the active semiconductor material and the buried insulating material adjacent to the active region such that the portion of the base substrate may be exposed. Herein, the portion of the base substrate may be electrically coupled to the contact region. In accordance with some illustrative examples, the method may still further comprise forming a contact structure over the portion of the base substrate.

In accordance with some illustrative embodiments of the second aspect above, forming the contact region may comprise implanting dopants into the base substrate in the active region, wherein a well region is formed in the base substrate under the ferroelectric gate structure.

In accordance with some illustrative embodiments of the third aspect above, the following relations may be valid: V1, V2, V3>0, and Vref=0. In a special but not limiting example herein, V1 may be equal to 5 V, V2 may be equal to +2 V, and V3 may be equal to −3 V.

FIG. 1 schematically illustrates a semiconductor device structure 100 in accordance with some illustrative embodiments of the present disclosure. The semiconductor device structure 100 may be formed in and above a substrate of an SOI type. In general, a substrate of an SOI type may comprise a base substrate 101, a buried insulating material 105a, 105b over the base substrate 101, and an active semiconductor material 106a, 106b, 106c formed on the buried insulating material 105a, 105b.

As illustrated in FIG. 1, the accordingly provided SOI structure may have an isolation structure, such as a plurality of insulating elements 102a, 102b and 102c, formed in an upper surface of the base substrate material 101, wherein at least two regions at an upper surface portion of the base substrate material 101 are separated by means of the insulating elements. For example, a region comprising the active semiconductor material 106a and the buried insulating material 105a may be separated from another region comprising the active semiconductor materials 106b, 106c and the buried insulating material 105b by means of the insulating element 102b. The active semiconductor materials 106b and 106c may be further separated by an optional insulating element 102d which terminates on the buried insulating material 105b, possibly partially extending into the buried insulating material 105b. In accordance with some illustrative examples, the active semiconductor materials 106a, 106b, 106c may be formed by a silicon material, e.g., silicon, silicon germanium and the like.

In accordance with some illustrative embodiments of the present disclosure, the insulating elements 102a to 102d may be formed in accordance with known processes employed when forming shallow trench isolation (STI) structures. The person skilled in the art will appreciate, though the insulating element 102c is depicted as extending deep into the base substrate 101 when compared to the insulating elements 102a, 102b, 102d, this does not pose any limitation on the present disclosure. Instead, the insulating element 102c may be formed similarly to the insulating elements 102a, 102b, extending to a similar depth level into the base substrate 101.

In accordance with some illustrative embodiments of the present disclosure, active regions A1 and A2 may be provided in accordance with the insulating elements 102a, 102b and 102c. For example, the active semiconductor material 106a and the buried insulating material 105a may be laterally enclosed by the insulating elements 102a and 102b, while the active semiconductor materials 106b, 106c and the buried insulating material 105b may be laterally enclosed by the insulating elements 102b and 102c. Although the active regions A1 and A2 may be separated by only one insulating element, i.e., the insulating element 102b, this does not pose any limitation to the present disclosure and the person skilled in the art will appreciate that the active regions A1 and A2 may be separated by more than one insulating element such that at least one further active region (not illustrated) may be formed between the active regions A1 and A2.

With regard to FIG. 1, the first active region A1 comprises a semiconductor device formed by a gate structure 110a and raised source/drain regions 122a, which are disposed at opposing sides of the gate structure 110a and may be formed on or above the active semiconductor layer 106a.

In accordance with illustrative embodiments of the present disclosure, the gate structure 110a may be formed by a gate dielectric structure 111a, e.g., comprising a silicon oxide material and/or a high-k material, such as an hafnium oxide material, and possibly one or more work function adjusting material, e.g., TiN and the like, a gate electrode material 113a, and a gate silicide region 115a being in contact with a gate contact 193a. A separation between the gate structure 110a and raised source/drain regions 122a may be adjusted by a sidewall spacer structure 117a formed on sidewalls of the gate electrode material 113a and the gate dielectric structure 111a. Furthermore, the sidewall spacer structure 117a may adjust a distance between the gate structure 110a and silicide regions 185a formed on the raised source/drain regions 122a, the silicide regions 185a being in contact with source/drain contacts 191a.

In accordance with some special illustrative embodiments of the present disclosure, the gate dielectric structure 111a may comprise a ferroelectric material, such as a ferroelectric high-k material, e.g., a ferroelectric hafnium oxide material, as described in greater detail below.

In accordance with some illustrative embodiments of the present disclosure, a back bias contact structure contacting the region 104a for applying a back bias to the base substrate 101 may be formed adjacent to the semiconductor device in the first active region A1, as will be now described in greater detail. The back bias contact structure may be formed by a back bias contact 187a and a back bias silicide region 183a provided in a contact region 104a, which is provided at an upper surface of the base substrate in the active region A1 below the gate structure 110a. This does not pose any limitation to the present disclosure and in accordance with some alternative embodiments of the present disclosure, the back bias silicide region 183a may be omitted, in which case a higher ohmic resistance is provided between the back bias contact 187a and the contact region 104a (upon applying a static voltage as a back bias, the higher ohmic resistance may be acceptable).

In accordance with some special illustrative embodiments of the present disclosure, the contact region 104a may be provided by a first well region 104a, which may be separated from the body of the base substrate 101 by a second well region 103a. The second well region 103a may be formed below the first well region 104a within the base substrate 101 and may be counter-doped relative to the first well region 104a so as to insulate the first well region 104a from the body of the base substrate 101. For example, the first well region 104a may be N-doped (N, N+ or N++) while the second well region 103a may be P-doped (P, P+ or P++). This does not pose any limitation on the present disclosure and the person skilled in the art will appreciate that the second well region may be optional, e.g., when the base substrate is pre-doped with dopants of P-type, the first well region 104a may be N-doped and the second well region 103a may be omitted.

In accordance with some illustrative embodiments of the present disclosure, two semiconductor devices comprising gate structures 110b and 110c may be provided in the active region A2 over the base substrate 101. This does not pose any limitation to the present disclosure and, instead, any other number of semiconductor devices may be formed in the second active region A2 (e.g., a single semiconductor device, three semiconductor devices, four semiconductor devices, etc.). The semiconductor devices may be separated by the optional insulating element 102d that may separate the active semiconductor materials 106b and 106c on the buried insulating material 105b, wherein a first sub-region A2a of the active region A2 and a second sub-region A2b of the active region A2 are formed.

In accordance with some illustrative embodiments of the present disclosure, a back bias may be applied to the active region A2 and the active region A2 may have a back bias contact structure comprising a back bias contact 187b electrically connected to a back bias silicide region 183b formed in a contact region 104b at an upper surface of the base substrate 101 in the active region A2. Via the back bias contact 187b, a back bias may be simultaneously applied to each of the semiconductor devices provided by the gate structures 110b and 110c in the active region A2. In contrast, a back bias applied by the back bias contact 187a may be only supplied to the contact region 104a of the active region A1. The person skilled in the art will appreciate that, depending on a depth of the insulating elements 102a, 102b and 102c reaching into the base substrate material 101, a back bias applied to one of the back bias contacts 187a and 187b may be confined to the respective one of the active regions A1, A2. Accordingly, each of the active regions A1 and A2 may be back-biased, independent of a possible back bias in the other one of the active regions A1 and A2.

As illustrated in FIG. 1, a semiconductor device formed by the gate structure 110b may further comprise a gate dielectric structure 111b, e.g., comprising a silicon oxide material and/or a high-k material, such as an hafnium oxide material, and possibly one or more work function adjusting materials, e.g., TiN and the like, a gate electrode material 113b, and a gate silicide region 115b being in contact with a gate contact 193b. A separation between the gate structure 110b and raised source/drain regions 122b formed at opposing sides of the gate structure 110b may be adjusted by a sidewall spacer structure 117b formed on sidewalls of the gate electrode material 113b and the gate dielectric structure 111b. Furthermore, the sidewall spacer structure 117b may adjust a distance between the gate structure 110b and silicide regions 185b formed on the raised source/drain regions 122b, the silicide regions 185b being in contact with source/drain contacts 191b.

In accordance with some special illustrative embodiments of the present disclosure, the gate dielectric structure 111b may comprise a ferroelectric material, such as a ferroelectric high-k material, e.g., a ferroelectric hafnium oxide material, as described in greater detail below.

As illustrated in FIG. 1, a semiconductor device formed by the gate structure 110c may further comprise a gate dielectric structure 111c, e.g., comprising a silicon oxide material and/or a high-k material, such as an hafnium oxide material, and possibly one or more work function adjusting materials, e.g., TiN and the like, a gate electrode material 113c, and a gate silicide region 115c being in contact with a gate contact 193c. A separation between the gate structure 110c and raised source/drain regions 122c formed at opposing sides of the gate structure 110c may be adjusted by a sidewall spacer structure 117c formed on sidewalls of the gate electrode material 113c and the gate dielectric structure 111c. Furthermore, the sidewall spacer structure 117c may adjust a distance between the gate structure 110c and silicide regions 185c formed on the raised source/drain regions 122c, the silicide regions 185c being in contact with source/drain contacts 191c.

In accordance with some special illustrative embodiments of the present disclosure, the gate dielectric structure 111c may comprise a ferroelectric material, such as a ferroelectric high-k material, e.g., a ferroelectric hafnium oxide material, as described in greater detail below.

In accordance with some illustrative embodiments of the present disclosure, the contacts 187a, 191a and 193a (together with the respective contacts in the second active region A2) may be embedded into a contact dielectric 186, e.g., a low-k material. Furthermore, a TPEN or CPEN material 185 may be deposited by CVD methods to impose tensile or compressive strain on the semiconductor device structure 100 and to electrically insulate the back bias contacts 187a and 187b from the active semiconductor materials 106a and 106b.

In the following, semiconductor devices, semiconductor device structures and methods of forming according semiconductor devices and semiconductor device structures in accordance with various further exemplary embodiments of the present disclosure will be described with regard to the attached figures, wherein a semiconductor device having a ferroelectric gate structure is fabricated. The described process steps, procedures and materials are to be considered as only exemplary and to illustrate to one of ordinary skill in the art illustrative methods for practicing the subject matter disclosed herein. However, it is to be understood that the invention is not exclusively limited to the illustrated and described exemplary embodiments, as many possible modifications and changes may exist which will become clear to the person skilled in the art when studying the present detailed description together with the accompanying drawings and the above background and summary of the invention. Illustrated portions of semiconductor devices may include only a limited number of elements, although those skilled in the art will recognize the actual implementations of semiconductor devices may include a large number of such elements. Various steps in the manufacture of semiconductor devices and semiconductor device structures are well known and so, in the interest of brevity, many conventional steps will only be mentioned briefly or will be omitted entirely without providing the well-known process details.

Figure 2A:
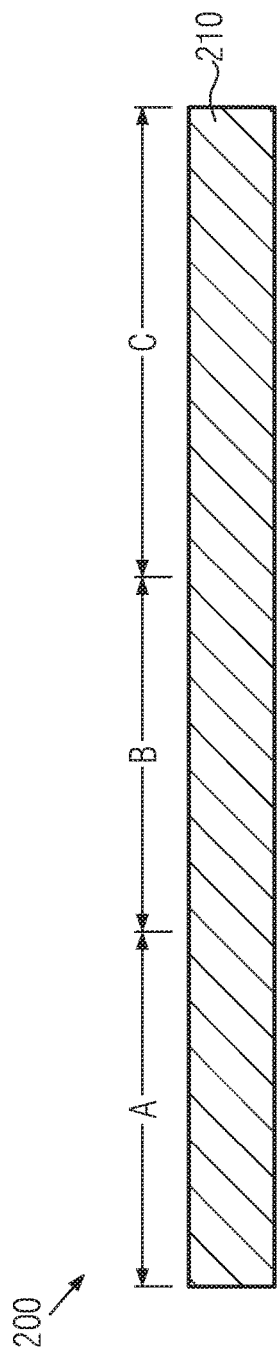

FIG. 2a schematically illustrates, in a cross-sectional view, a semiconductor device structure 200 at an early stage during front-end-of-line (FEOL) processing, particularly at a stage when a substrate 210 is provided. The substrate may have a configuration that is substantially similar to the above-described substrate structure of the SOI type, wherein the substrate 210 represents an upper surface portion of an active semiconductor material of, e.g., a silicon-on-insulator (SOI) substrate or silicon/germanium-on-insulator (SGOI) substrate, among other known SOI configurations. In general, the term "substrate" may be understood to cover all kinds of SOI substrates known in the art and employed in the fabrication of semiconductor devices and semiconductor device structures, particularly semiconductor substrates and semiconducting substrates. The person skilled in the art will appreciate that no limitation to a special kind of SOI substrate is intended.

At the stage illustrated in FIG. 2a, the substrate 210 may comprise a first active region A, a second active region B, and a third active region C. However, this does not pose any limitation on the present disclosure, and the person skilled in the art will appreciate that any appropriate number of active regions may be implemented instead. For example, in accordance with some illustrated embodiments (not illustrated), the substrate 210 may only comprise one active region (active region A) or may comprise two active regions (active region A and one of the active regions B and C) or may comprise more than three active regions (active regions A, B, C and at least one additional active region).

The person skilled in the art will appreciate that, in general, an active region may indicate a region of an upper surface portion of the substrate 210 in and/or over which a semiconductor device is to be formed. In accordance with some special examples herein, the first active region A may represent an active region in and over which a FeFET device is to be formed. In the second active region B, an IO semiconductor device representing an input/output controlling device may be formed. For example, the third active region C may represent an active region in and above which a logic device is to be formed. However, this does not pose any limitation to the present disclosure, and other semiconductor devices, such as passive devices (capacitors, resistors, etc.) may be formed instead in and above at least one active region.

In accordance with some illustrative embodiments of the present disclosure, at least one of the active regions A, B, C may be doped with a dopant, such as a P-type dopant or an N-type dopant. Alternatively or additionally, at least one insulating structure, e.g., a shallow trench isolation (STI), may be formed between two adjacent active regions for separating two adjacent active regions. Although the first active region A is illustrated as being located next to the second active region B, which is in turn illustrated as being located next to the third active region C, this does not pose any limitation on the present disclosure, and the person skilled in the art will appreciate that at least one further active region (not illustrated) may be located in between the first active region A and/or the second active region B and/or the third active region C.

Figure 2B:
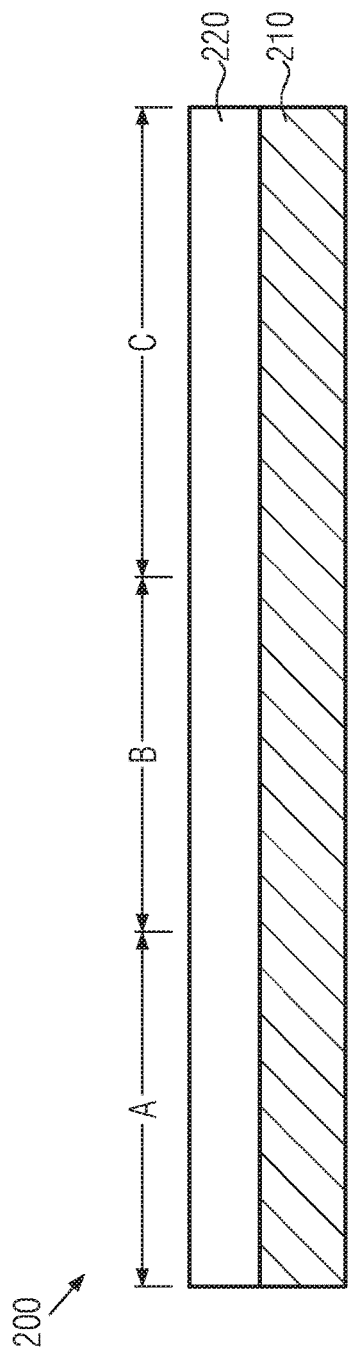

FIG. 2b schematically illustrates the semiconductor device structure 200 at a more advanced stage during fabrication, after a hafnium oxide material layer 220 is formed over the substrate 210. In accordance with some illustrative embodiments herein, the hafnium oxide material layer 220 may be blanket deposited on an upper surface of the substrate 210 in the first active region A, the second active region B and the third active region C. In accordance with some illustrative examples herein, the hafnium oxide material layer 220 may be deposited by atomic layer deposition (ALD) techniques and the like. In some special examples herein, the hafnium oxide material layer 220 may be formed by $HfO_2$, substantially without dopants.

In accordance with some illustrative embodiments of the present disclosure, the hafnium oxide material layer 220 may have a thickness greater than 5 nm. In accordance with some special illustrative embodiments herein, the hafnium oxide material layer 220 may have a thickness in a range from about 7-10 nm.

FIG. 2c schematically illustrates the semiconductor device structure 200 at a more advanced stage during fabrication, after a masking pattern M1 is formed over the substrate 210 at the first active region A, the second active region B and the third active region C. The masking pattern M1 leaves the first active region A exposed to further processing, while the second and third active regions B, C are covered by a masking material, e.g., a mask or hard mask material. Accordingly, the second and third active regions B, C may be protected during subsequent processing due to the masking pattern M1.

In accordance with some illustrative embodiments of the present disclosure, the masking pattern M1 may be formed by known lithographical or photo lithographical techniques, e.g., by depositing a photoresist and lithographically patterning the photoresist in accordance with known techniques. Optionally, a hard mask may be provided by depositing a hard mask material and patterning the hard mask material in accordance with known techniques.

In accordance with some illustrative embodiments of the present disclosure, the masking pattern M1 leaves an upper surface region USA (see FIG. 2d) of the first active region A exposed to subsequent processing.

FIG. 2d schematically illustrates the semiconductor device structure 200 at a more advanced stage during fabrication, when an implantation process 222 is performed. In accordance with some illustrative embodiments of the present disclosure, the implantation process 222 may comprise implanting at least one of silicon (Si), zirconium (Zr), lanthanum (La), aluminum (Al), yttrium (Y) and gadolinium (Gd). Accordingly, a doped hafnium oxide material layer portion 220A may be formed in the first active region A in alignment with the masking pattern M1. The doped hafnium oxide material layer portion 220A may be one of $Si:HfO_2$, $Zr:HfO_2$ or $Ti:HfO_2$.

In accordance with a special illustrative example herein, the doped hafnium oxide material layer portion 220A may comprise $Si:HfO_2$ having a mole fraction of Si lower than about 0.1. In accordance with some special illustrative examples herein, the mole fraction may be in a range from about 0.02-0.04.

In accordance with a special illustrative example herein, the doped hafnium oxide material layer portion 220A may comprise $Zr:HfO_2$ having a mole fraction of Zr lower than about 0.1. In accordance with some special illustrative examples herein, the mole fraction may be in a range from about 0.01-0.06.

In accordance with a special illustrative example herein, the doped hafnium oxide material layer portion 220A may comprise $Ti:HfO_2$ having a mole fraction of Ti in a lower mole fraction range, e.g., a mole fraction lower than 0.1 in some special illustrative examples.

In accordance with some illustrative embodiments of the present disclosure, the implantation process 222 may be performed with an implantation dose of about 1e16 atoms/$cm^2$.

FIG. 2e schematically illustrates the semiconductor device structure 200 at a more advanced stage during fabrication, after the implantation process 222 is completed and the masking pattern M1 is removed. Accordingly, the semiconductor device structure 200 as illustrated in FIG. 2e shows a hafnium oxide material layer 220 extending across the second and third active regions B, C, while the doped hafnium oxide material layer portion 220A is formed in the first active region A. The doped hafnium oxide material layer portion 220A is formed in the first active region A in alignment with the masking pattern M1 of FIG. 2d.

FIG. 2f schematically illustrates the semiconductor device structure 200 at a more advanced stage during fabrication, after a masking pattern M2 is formed over the substrate 210. In accordance with some illustrative embodiments of the present disclosure, the masking pattern M2 covers the first and second active regions A, B, while leaving an upper surface portion USC of the third active region C exposed to further processing. The first and second active regions A, B may be protected during subsequent processing by the masking pattern M2.

In accordance with some illustrative examples of the present disclosure, the upper surface portion USC of the third active region C may be defined relative to the doped hafnium oxide material layer portion 220A. For example, an alignment of the masking pattern M2 may depend on an alignment of the masking pattern M1.

FIG. 2g schematically illustrates the semiconductor device structure 200 at a more advanced stage during fabrication, when an etching process 224 is performed in alignment with the masking pattern M2 in the third active region C. In accordance with some illustrative examples herein, the etching process 224 may comprise at least one anisotropic etching step, such as an anisotropic wet etching or dry etching.

FIG. 2h schematically illustrates the semiconductor device structure 200 at a more advanced stage during fabrication, after the etching process 224 is completed and an upper surface region 210U of the substrate 210 is exposed in the third active region C. Accordingly, the hafnium oxide material layer 220 is removed from above the substrate 210 in the third active region C, wherein the upper surface region 210U of the substrate 210 is exposed, and wherein a hafnium oxide material layer portion 220B is left in the second active region B in alignment with the masking pattern M2 and the doped hafnium oxide material layer portion 220A.

Figure 2I:
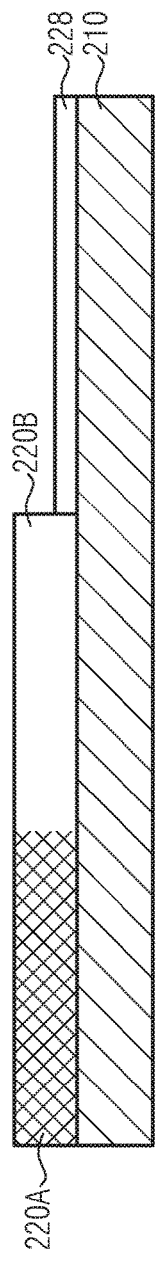

FIG. 2i schematically illustrates the semiconductor device structure 200 at a more advanced stage during fabrication, after a deposition process (not illustrated), e.g., a blanket deposition process, is completed and an additional high-k material layer 228 is formed over the third active region C in accordance with the masking pattern M2. After having formed the additional high-k material layer 228, the masking pattern M2 is removed and the second active regions B and the third active region C are exposed to further processing, e.g., a strip process (not illustrated) is performed for removing the masking pattern M2. The additional high-k material layer 228 may have a thickness which is substantially smaller than a thickness of the hafnium oxide material layer 220. For example, the additional high-k material layer 228 may have a thickness of about 5 nm or less. In accordance with some illustrative embodiments of the present disclosure, the additional high-k material layer may comprise at least one of hafnium oxide, hafnium silicon oxynitride and the like.

This does not pose any limitation to the present disclosure and the person skilled in the art will appreciate that the additional high-k material layer may have a thickness that is substantially equal to or greater than a thickness of the high-k material layer 220 (FIG. 2b). In case that the same high-k material is to be formed over the active regions A to C, the process steps as described above with regard to FIGS. 2f to 2i may be omitted.

In accordance with some alternative embodiments (not illustrated), the masking pattern M2 may be removed prior to depositing the additional high-k material 228, such that the additional high-k material may be deposited over each of the active regions A to C.

Figure 2J:
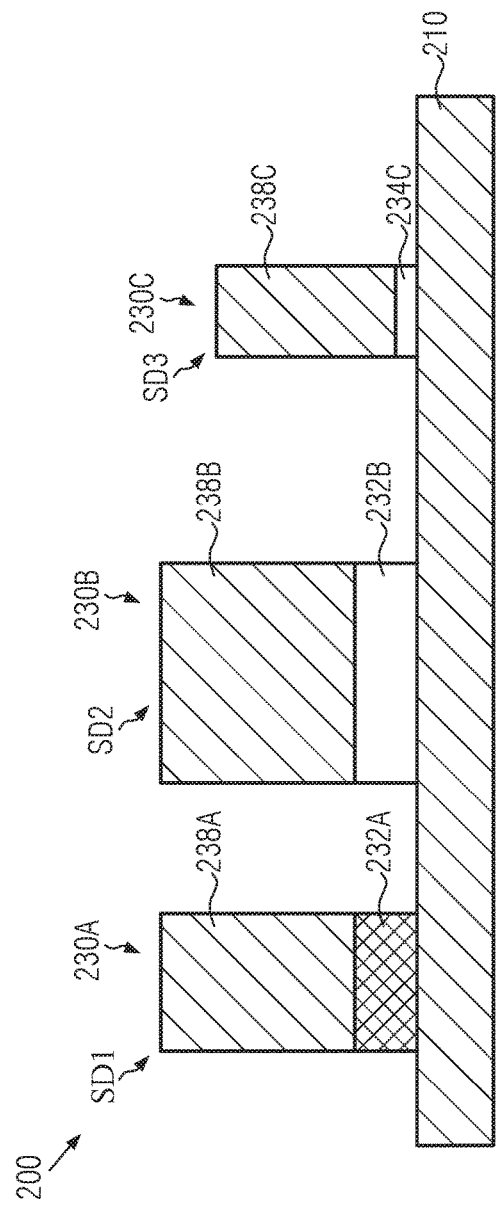

FIG. 2j schematically illustrates the semiconductor device structure 200 at a more advanced stage during fabrication, after gate structures 230A, 230B and 230C are formed by depositing a gate electrode material layer over the hafnium oxide material layers 220A, 220B in the first and second active regions A, B, and over the additional high-k material layer 228 in the third active region C. Herein, the ferroelectric gate structure 230A is formed in the first active region A. After patterning the deposited layers by an anisotropic etching process, together with an appropriate gate mask pattern (not illustrated), the gate structures 230A, 230B and 230C are formed.

In accordance with some illustrative embodiments of the present disclosure, a first semiconductor device SD1 comprising the ferroelectric gate structure 230A, a second semiconductor device SD2 comprising the gate structure 230B and a third semiconductor device SD3 comprising the gate structure 230C may be provided. The first semiconductor device SD1 is formed in the first active region A, the second semiconductor device SD2 is formed in the second active region B and the third semiconductor device SD3 is formed in the third active region C.

In accordance with some illustrative embodiments of the present disclosure, the ferroelectric gate structure 230A comprises a gate dielectric comprising a doped hafnium oxide material layer 232A. The doped hafnium oxide material layer 232A may be formed by patterning the doped hafnium oxide material layer 220A subsequent to the stage shown in FIG. 2i. This does not pose any limitations to the present disclosure and the person skilled in the art will appreciate that an additional high-k material layer (not illustrated) may be provided in the first active region on the doped hafnium oxide material layer 232A. The gate structure 230A may further comprise a work function adjusting material layer (not illustrated, optional) and a gate electrode layer 238A, e.g., a polysilicon material layer, an amorphous silicon material layer, a metal suitable for gate electrodes and the like.

In accordance with some illustrative embodiments of the present disclosure, the gate structure 230B comprises a gate dielectric comprising an hafnium oxide material layer 232B. This does not pose any limitations to the present disclosure and the person skilled in the art will appreciate that an additional high-k material layer (not illustrated) may be provided in the second active region on the hafnium oxide material layer 232B. The hafnium oxide material layer 232B is formed by patterning the hafnium oxide material layer 220B subsequent to the stage shown in FIG. 2i. The gate structure 230B may further comprise a work function adjusting material layer (not illustrated, optional) and a gate electrode layer 238B, e.g., a polysilicon material layer, an amorphous silicon material layer, a metal suitable for gate electrodes and the like.

In accordance with some illustrative embodiments of the present disclosure, the gate structure 230C comprises a gate dielectric material comprising an additional high-k material layer 234C. The gate structure 230C may further comprise an optional work function adjusting material layer (not illustrated, optional) and a gate electrode material layer 238C, e.g., a polysilicon material layer, an amorphous silicon material layer, a metal suitable for gate electrodes and the like. In accordance with some special illustrative examples herein, the gate dielectric may only include the additional high-k material layer 234C.

After a complete reading of the present disclosure regarding the FIGS. 2a-2j, the person skilled in the art will appreciate that semiconductor devices having a thick gate dielectric material (such as the first and second semiconductor devices SD1, SD2) may be fabricated in parallel with a semiconductor device having a comparatively thin gate dielectric material (such as the third semiconductor device SD3) used for logic applications.

After a complete reading of the present disclosure regarding the FIGS. 2a-2j, the person skilled in the art will appreciate that the semiconductor device structures 200, as described above with regard to various embodiments of the present disclosure, may be fabricated in accordance with CMOS technologies having embedded NVM devices (e.g., the semiconductor device SD1) by means of employing the gate dielectric material formed in the process for fabricating IO-gate-stacks into a ferroelectric FET device by dopant implantation, such as the implantation process 222. The various process flows as described above show a simple implementation of an embedded ferroelectric FET into a CMOS process flow having different gate stack formations (230A, 230B, 230C) and one implantation step (222).

Figure 3A:
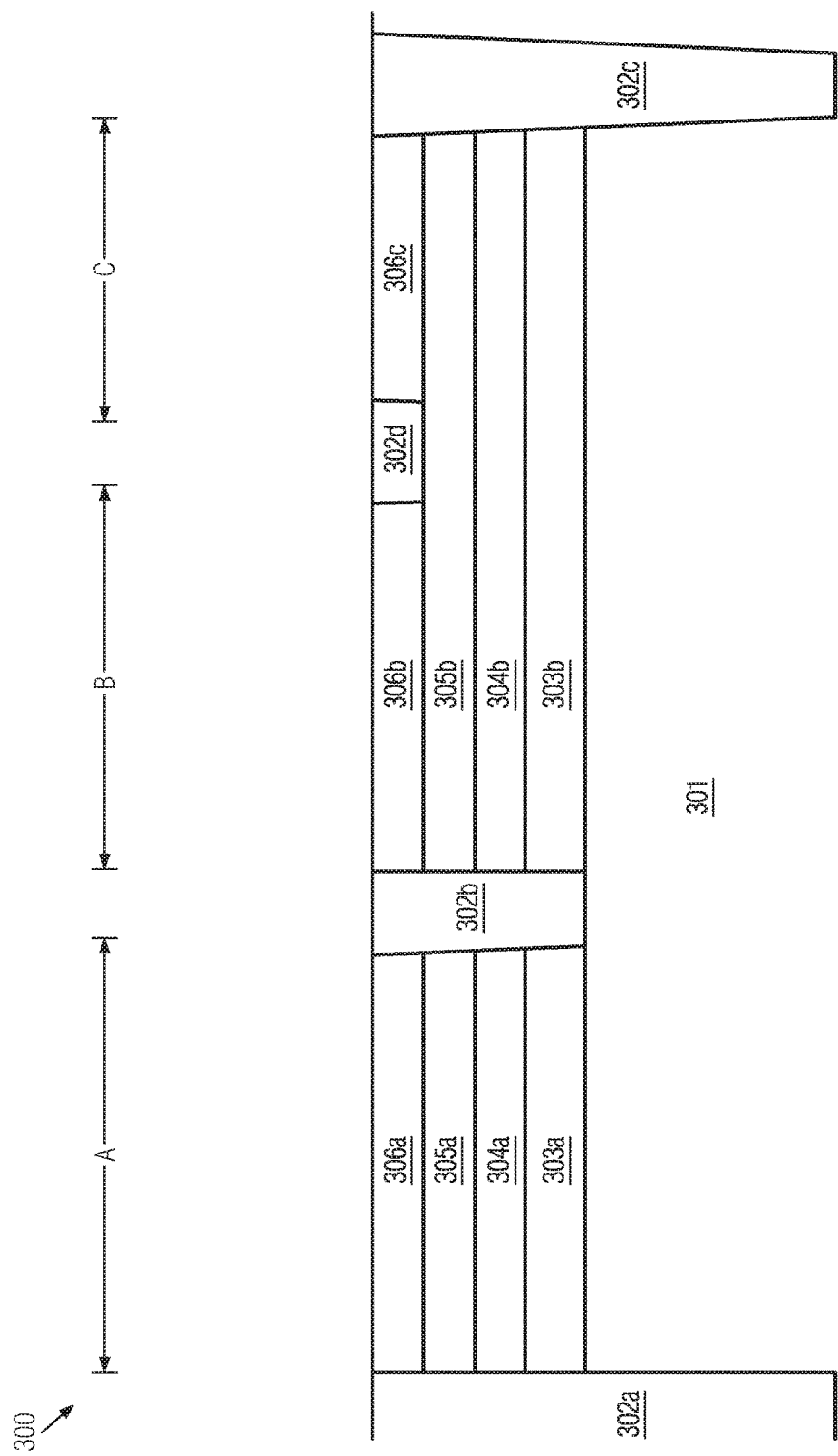
FIGS. 3a-3i schematically illustrate a process in accordance with some illustrative embodiments of the present disclosure, wherein contact regions are formed.

With regard to FIGS. 3a-3h, a process of forming a semiconductor device structure 300 will be described. The person skilled in the art will appreciate that, as a starting point, a substrate configuration in accordance with an SOI configuration as described above with regard to FIGS. 1 and 2a may be provided. For example, the substrate 200 as depicted in FIG. 2a may be exposed to a process of forming insulating elements 302a, 302b, 302c and 302d. For example, an upper surface of the substrate 200 in FIG. 2a may be separated into several active regions A, B and C as illustrated in FIG. 3a. The person skilled in the art will appreciate that the base substrate material 301 may correspond to the base substrate as described above with regard to FIG. 1.

In accordance with some illustrative embodiments of the present disclosure, one or more implantation processes may be performed for implanting dopants into an upper surface region of the base substrate 301, wherein contact regions 304a, 304b are formed at an upper surface of the base substrate 301 below buried insulating materials 305a, 305b of the active regions A to C. In accordance with illustrative examples herein, N-type or P-type dopants may be implanted into the contact regions 304a, 304b, wherein well regions 304a, 304b are formed. In accordance with a special example, where the base substrate is undoped or doped with dopants of equal conductivity type as that of the well regions 304a, 304b, second well regions 303a, 303b may be formed below the contact regions 304a, 304b so as to electrically insulate the contact regions 304a, 304b and the body of the base substrate 301. In accordance with some illustrative examples herein, the implantation of the well regions 304a, 304b may be performed in alignment with the insulating elements 302a, 302b, 302c (and optionally 302d).

In accordance with illustrative embodiments of the present disclosure, active semiconductor materials 306a, 306b, 306c are disposed on the buried insulating materials 305a, 305b, similar to the active semiconductor material 106a, 106b, 106c as described above with regard to FIG. 1. The active semiconductor materials 306b and 306c are separated by the insulating element 302d. The insulating element 302d may be formed similar to the insulating element 102d as described above with regard to FIG. 1.

In accordance with some illustrative embodiments of the present disclosure, the insulating elements 302a to 302c may be formed in accordance with known STI techniques in which trenches are etched into the base substrate 301 and subsequently filled with an insulation material, e.g., at least one of silicon oxide and silicon nitride. In a special example, the insulating element 302d may be formed by etching a shallow trench into the active semiconductor material 306b, 306c, the trench stopping on an upper surface of the buried insulating material 305b (or at most partially extending into the buried insulating material 305b). When forming the insulating elements 302a to 302c, trenches may be etched deep into the base substrate 301, such as trenches which at least partially extend into the second wells 303a, 303b, 303c.

After a complete reading of the present disclosure, the person skilled in the art will appreciate that the insulating element 302d is optional and may be omitted in the following description without any limitation.

Figure 3B:
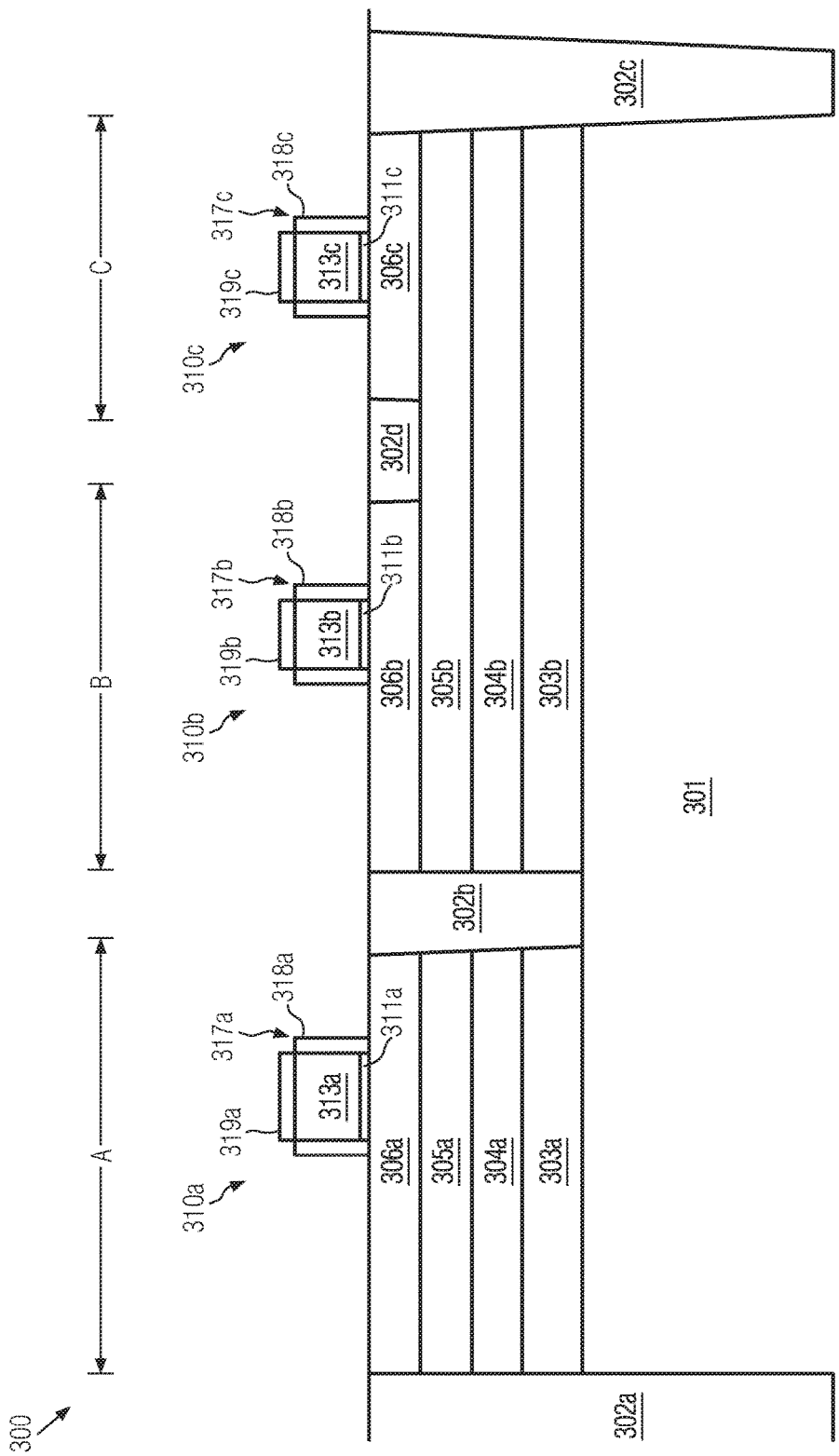

FIG. 3b schematically illustrates the semiconductor device structure at a more advanced stage during fabrication, after gate structures 310a, 310b and 310c are formed in the active regions A to C by depositing gate dielectric materials and gate electrode materials, and patterning the gate stacks from the deposited gate dielectric materials and gate electric materials, thereby forming respective gate stacks 311a, 313a, 311b, 313b and 311c, 313c, and forming sidewall spacers 318a, 318b and 318c covering sidewalls of the gate stacks 311a, 313a to 311c, 313c. Furthermore, gate caps 319a to 319c may be formed on upper surfaces of the gate electrode material 313a to 313c, thereby forming spacer structures 317a to 317c embedding and encapsulating the respective gate stacks 311a, 313a to 311c to 313c.

In accordance with some illustrative embodiments, techniques as described above with regard to FIGS. 2a-2j may be applied. Alternatively, techniques as described below with regard to FIG. 4g may be applied when forming the gate structures 310a, 310b and 310c. Accordingly, at least one of the gate structures 310a, 310b and 310c may be formed as a ferroelectric gate structure.

At the stage illustrated in FIG. 3b, a first semiconductor device comprising the gate structure 310a, a second semiconductor device comprising the gate structure 310b and a third semiconductor device comprising the gate structure 310c may be provided.

Figure 3C:
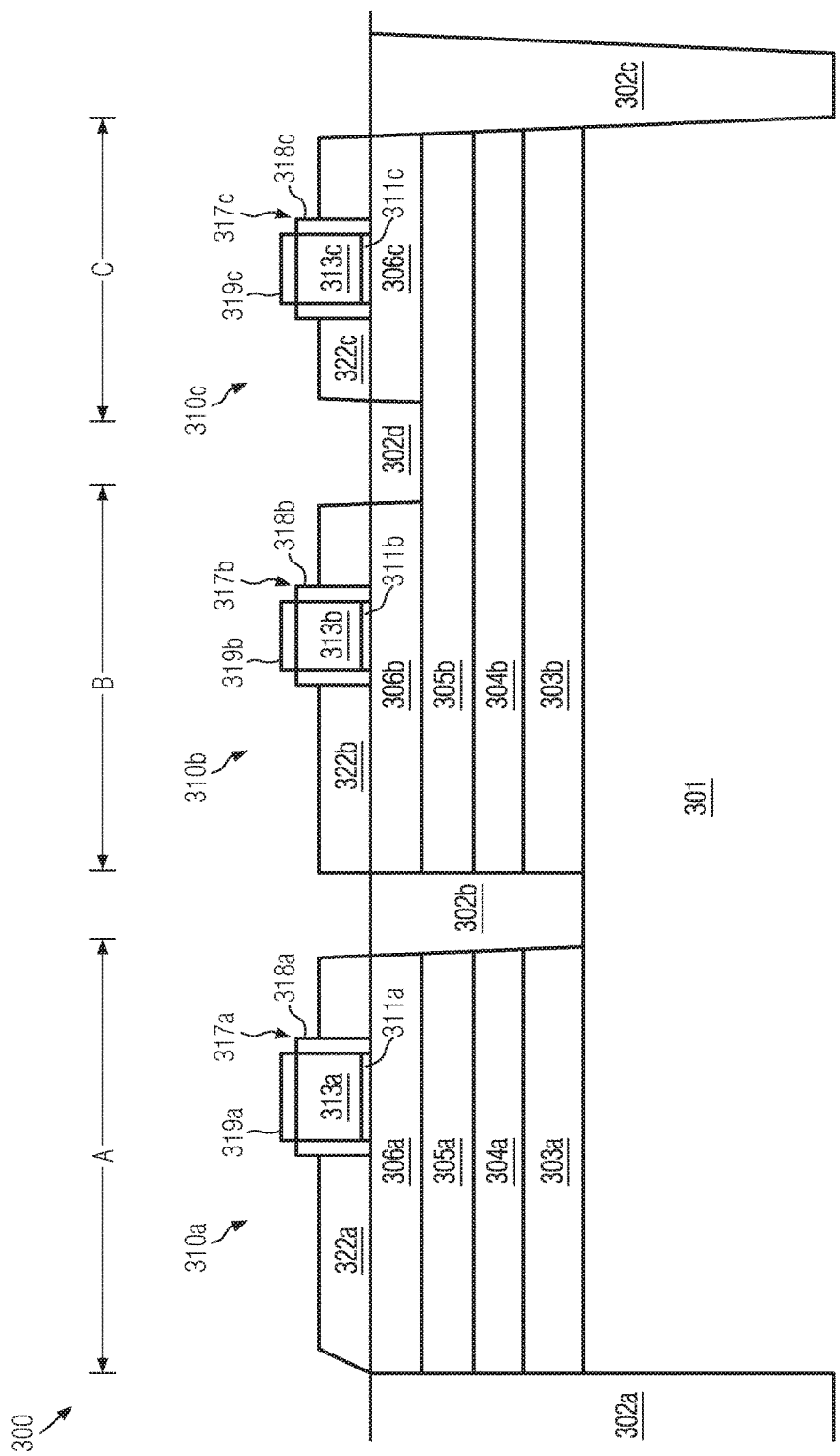

With regard to FIG. 3c, a more advanced stage during fabrication is illustrated, where an epitaxial growth process is performed for forming raised source/drain regions 322a to 322c on upper surfaces of the active semiconductor portions 306a to 306c adjacent the gate structures 310a to 310c. This does not pose any limitation to the present disclosure and formation of raised source/drain regions may be suppressed in alternative process flows.

Figure 3D:
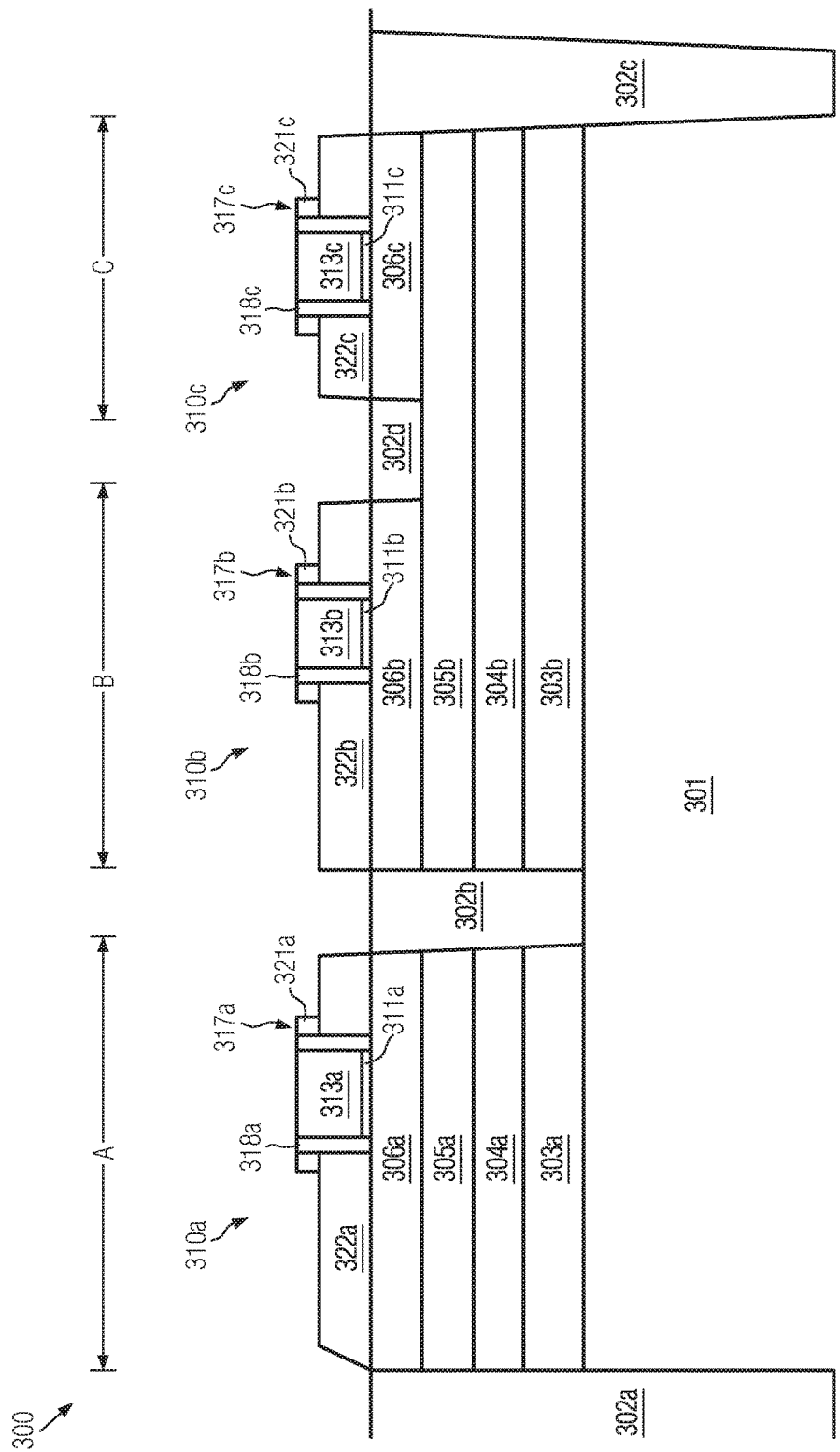

Next, as illustrated in FIG. 3d, the semiconductor device structure 300 is illustrated in a more advanced stage during fabrication, particularly after the gate caps 319a to 319c are removed and sidewall spacer extensions 321a to 321c are formed on upper portions of the sidewall spacers 318a to 318c being exposed from the raised source/drain regions 322a to 322c. In accordance with some illustrative embodiments of the present disclosure, the sidewall spacer extensions 321a to 321c may be formed by depositing an insulating material over the semiconductor device structure 300 and subsequently performing an anisotropic etching process, e.g., a reactive ion etch (RIE), for anisotropically etching of the deposited insulating material layer (not illustrated) to expose upper surfaces of the gate electrodes 313a to 313c and the raised source/drain regions 322a to 322c. The sidewall spacer extensions 321a to 321c may be formed in order to adjust a separation between the gate structures 310a to 310c and silicide contact regions (not illustrated) to be formed in and on the raised source/drain regions 322a to 322c.

Figure 3E:
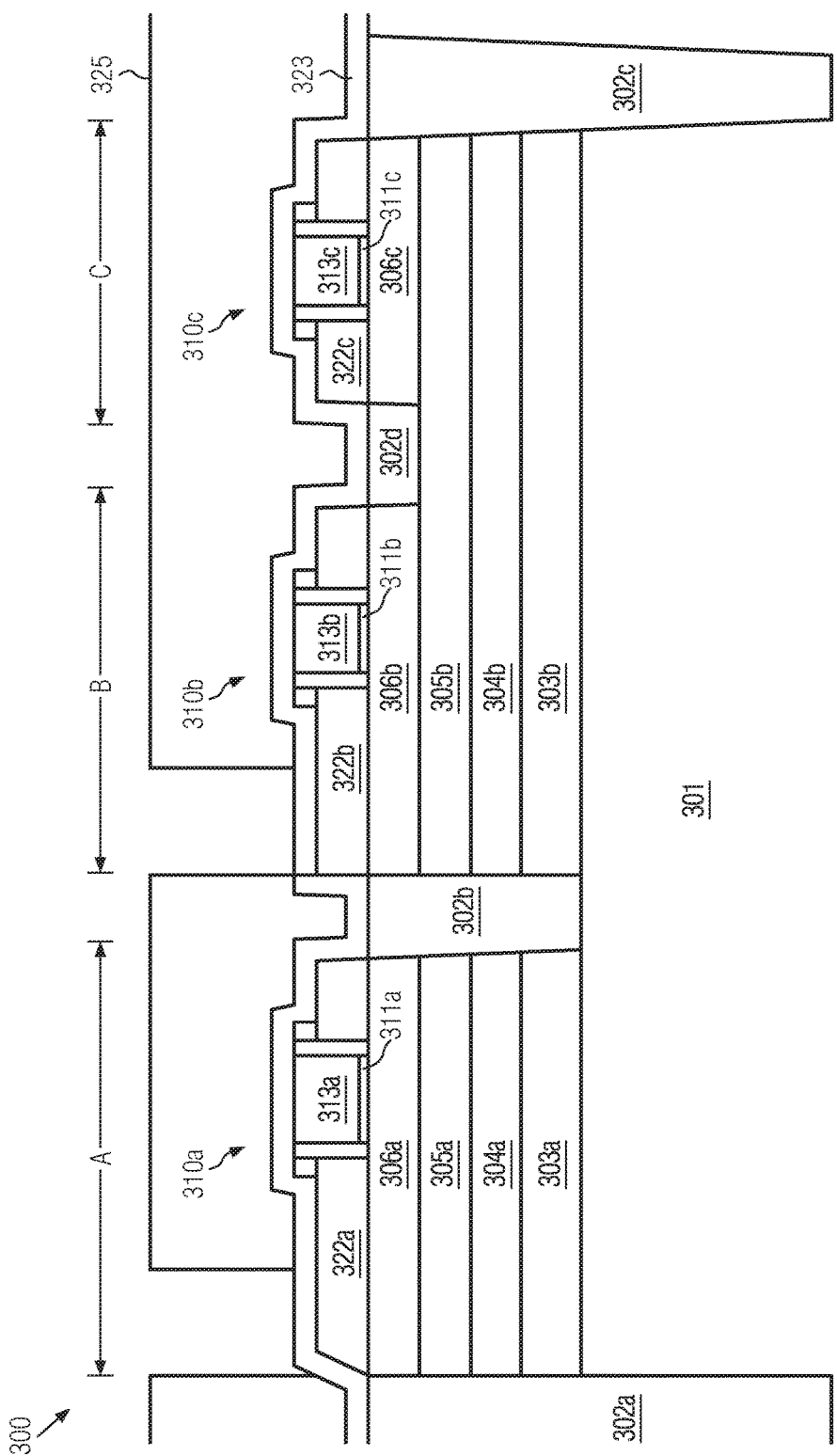

With regard to FIG. 3e, the semiconductor device structure 300 is schematically illustrated at a more advanced stage during fabrication, particularly after a patterned hard mask 323, 325 comprising an insulating material layer 323 and a patterned photoresist 325 is formed on the semiconductor device structure 300, e.g., by depositing the insulating material 323, e.g., a nitride material, and an unpatterned photoresist by spin-on techniques and photolithographically patterning the unpatterned photoresist to obtain the patterned photoresist 325.

Figure 3F:
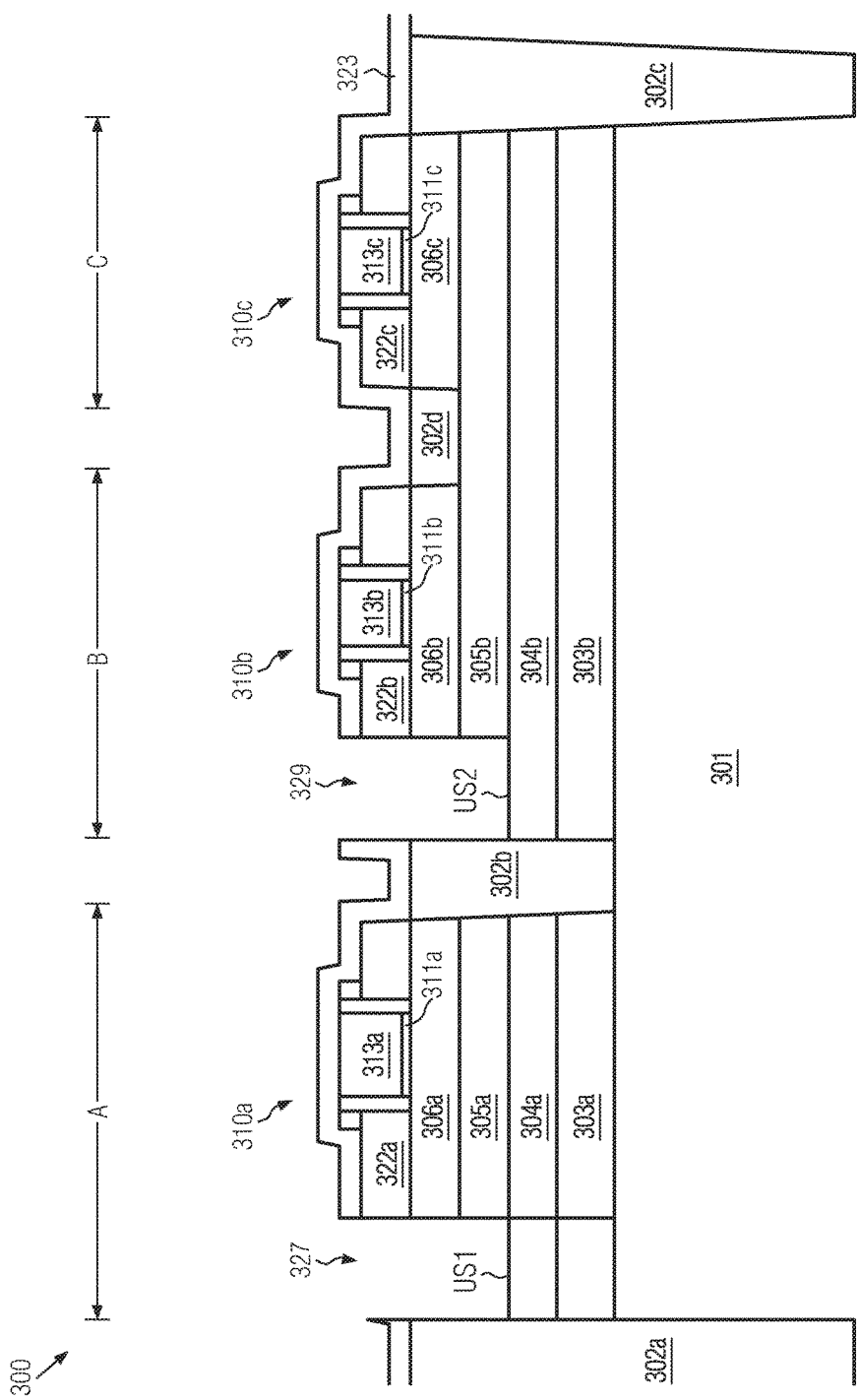

With regard to FIG. 3f, the semiconductor device structure 300 is schematically illustrated at a more advanced stage during fabrication, particularly after an etch sequence for exposing upper surface regions US1 and US2 of the contact regions 304a and 304b by etching trenches 327 and 329 into the active regions A and B, the trenches 327 and 329 ending on the upper surfaces US1 and US2 of the contact regions 304a and 304b. Subsequently, the photoresist may be stripped in a strip process (not illustrated). In accordance with some illustrative embodiments, the etching of the trenches 327, 329 may be a time-controlled etch process or a sequence of sequentially performed selective etching processes for selectively etching the active semiconductor material 306a to 306c and terminating when the buried insulating material 305a, 305b is reached, and selectively etching the buried insulating material 305a, 305b and terminating when contact regions 304a, 304b are reached.

Figure 3G:
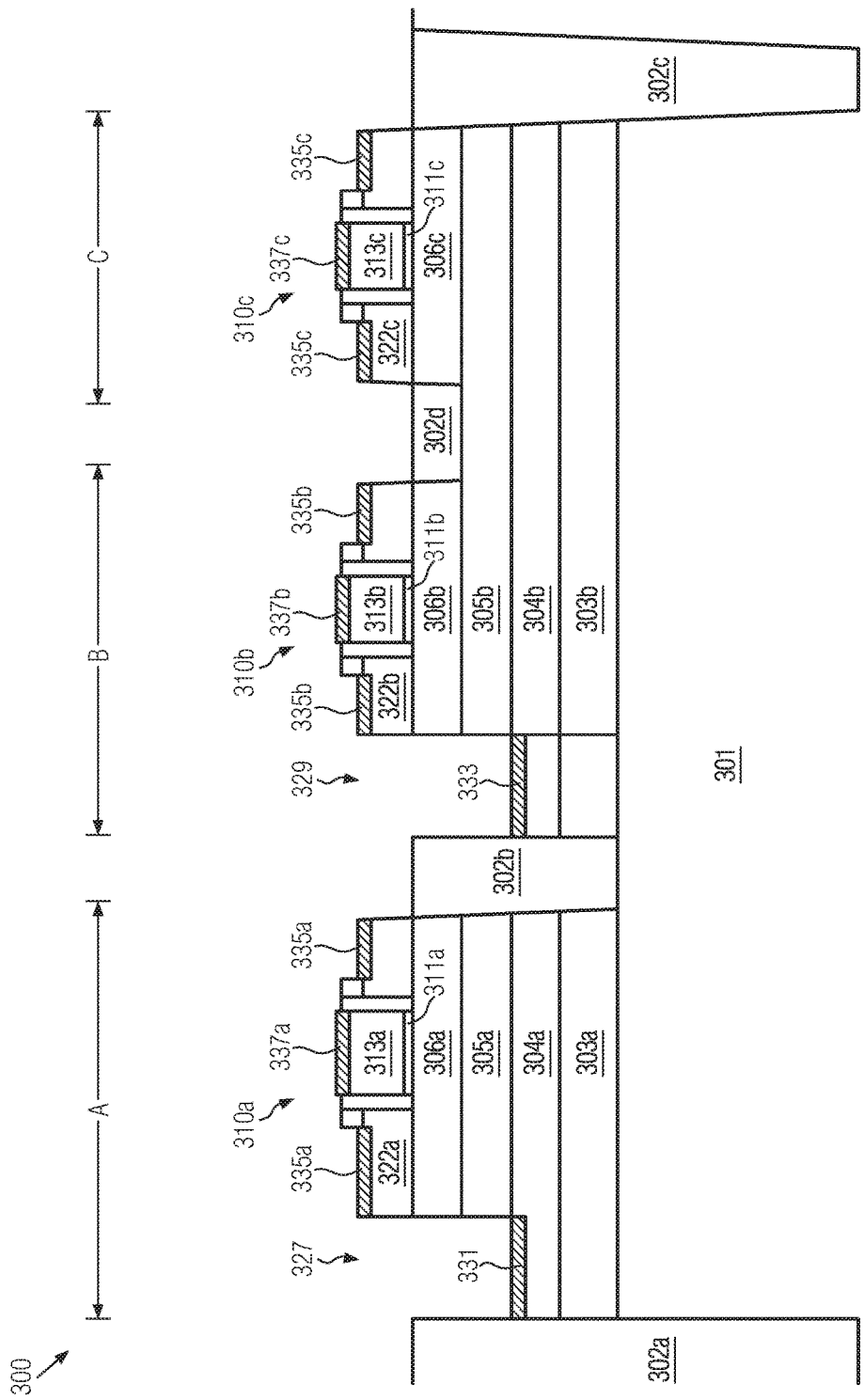

Next, as illustrated in FIG. 3g, the semiconductor device structure 300 is illustrated at a more advanced stage during fabrication, particularly after the remaining insulating material layer 323 is removed and silicide regions 331 and 333 are formed within the trenches 327 and 329 (at the bottom of the trenches 327, 329). Furthermore, silicide contacts to the semiconductor devices in the active regions A, B and C contacting the raised source/drain regions 322a to 322c via source/drain silicide regions 335a to 335c and gate silicide regions 337a to 337c contacting the gate electrodes 313a to 313c are formed. The person skilled in the art will appreciate that the formation of the silicide regions is achieved in accordance with known silicidation and, particularly, salicidation (self-aligned silicidation) processes during which a contact metal material is deposited, subjected to an annealing process for reacting the deposited contact metal material with semiconductor material to form silicide material and subsequently removing unreacted contact metal material from insulating material surfaces via an appropriate etch chemistry.

Figure 3H:
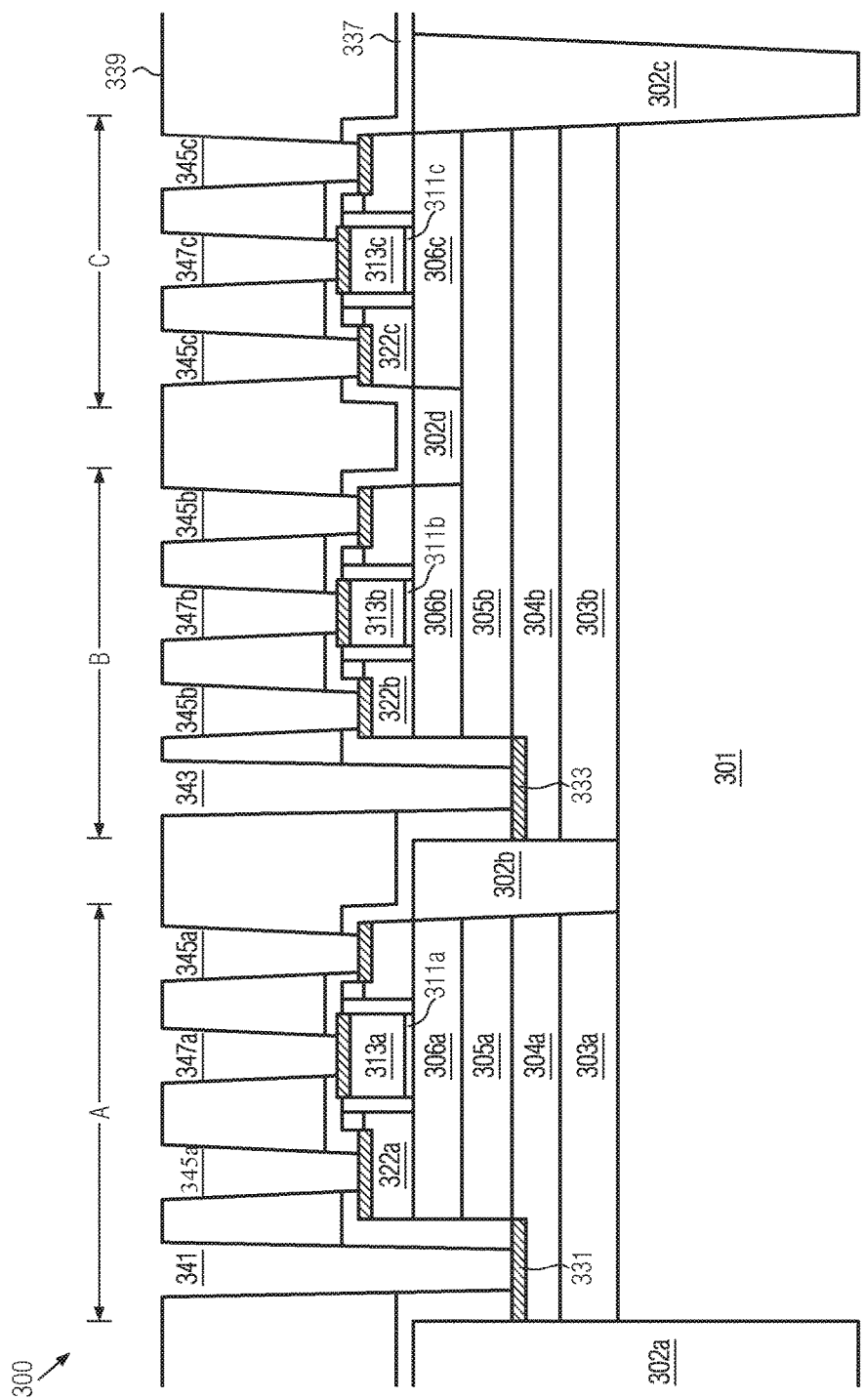

Next, as schematically illustrated in FIG. 3h, the semiconductor device structure 300 may be exposed to a process for depositing TPEN or CPEN material, e.g., by CVD techniques for depositing nitride material 337 with a predefined strain level, and by blanket-depositing a contact dielectric 339, e.g., a conventional interlayer dielectric material or a low-k material, and subsequently forming a masking pattern over the contact dielectric in accordance with a contact scheme for etching contact trenches 341, 343 to partially expose an upper surface of the silicide contact regions 331 and 333. Furthermore, contact trenches 345a to 345c partially exposing upper surfaces of the source/drain silicide regions and gate contact trenches 347a to 347c partially exposing an upper surface of the gate silicide regions may be etched in accordance with the masking pattern (not illustrated). Subsequently, the masking pattern (not illustrated) may be removed leaving the semiconductor device structure 300 as schematically illustrated in FIG. 3h.

Figure 3I:
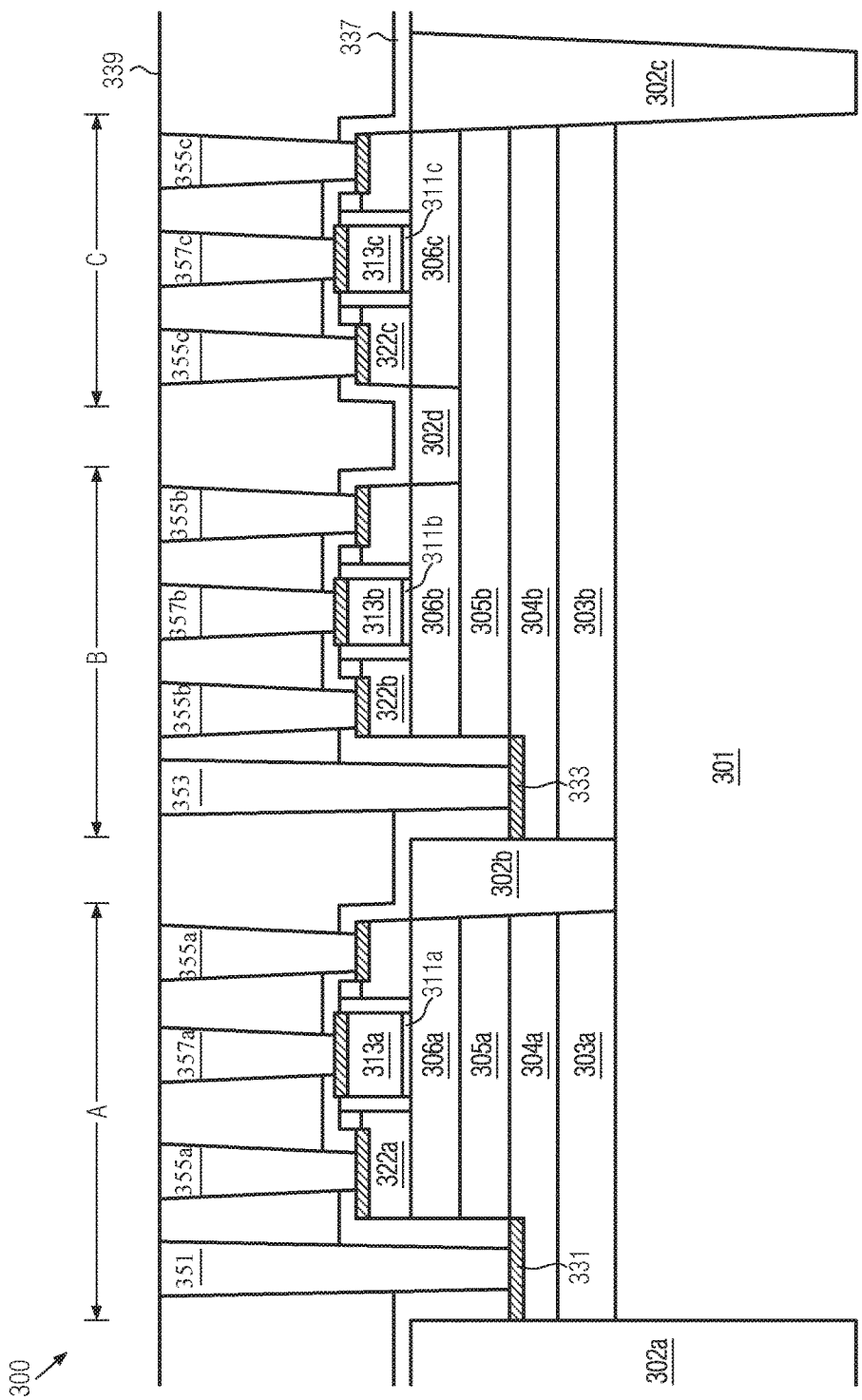

With regard to FIG. 3i, the semiconductor device structure 300 is schematically illustrated at a more advanced stage during fabrication, particularly after the trenches 341, 343, 345a to 345c and 347a to 347c are filled with a contact-forming material to form back bias contacts 351 and 353 contacting the respective back bias silicide regions 331, 333, and forming source/drain contacts 355a to 355c contacting the source/drain silicide regions, and gate contacts 357a to 357c contacting respective gate silicide regions.

The person skilled in the art will appreciate that the semiconductor device structure 300 as schematically illustrated in FIG. 3i may substantially correspond to the semiconductor device structure 100 as schematically illustrated in FIG. 1 and described above. An according description of the semiconductor device structure 300 as illustrated in FIG. 3i may be, therefore, conducted in accordance with the explanations as provided above with regard to FIG. 1 and reference to the discussion of FIG. 1 is made for further details on the semiconductor device structure 300.

In accordance with some illustrative embodiments of the present disclosure, the threshold voltage Vt of the semiconductor devices A to C may be selectively flashed by applying an appropriate back bias to the back bias contacts 351 and/or 353. Furthermore, the person skilled in the art will appreciate that, alternatively or additionally, back bias can be used for implementing small variations in the threshold voltage of the semiconductor devices A to C by appropriately applying a back bias to the back bias contact 351 and/or 353.

In accordance with some illustrative embodiments of the present disclosure when applying back bias to at least one ferroelectric gate, the threshold voltage Vt of the ferroelectric gate structure may be programmed, therefore implementing a NVM device. Programming of ferroelectric gate structures will be described below with regard to FIG. 4g in greater detail.

In accordance with some illustrative embodiments of the present disclosure, a voltage pulse having a peak value of one of more than about 5 V and less than about −5 V may be applied to the back bias contact 351 and/or 353 for creating a stable shift in the threshold voltage of the respective semiconductor device(s) in the semiconductor device structure 300 in case of a non-ferroelectric gate structure. In accordance with some explicit examples, a voltage of an absolute value of about at most 3 V may be further applied to the back bias contact 351 and/or 353 for tuning the threshold voltage. For example, the back bias for tuning the threshold voltage may be in a range from about 0.1 V to about 3 V or in a range from about −0.1 V to about −3 V.

The person skilled in the art will appreciate that semiconductor devices in accordance with various illustrative embodiments of the present disclosure may or may not be back-biased. In case of non-back-biased semiconductor devices, a given threshold voltage Vt is substantially based on the gate length. In contrast, back-biased semiconductor devices may have a tunable threshold voltage on the basis of the applied back bias. Additionally or alternatively, semiconductor devices in accordance with the present disclosure may allow for a change in the threshold voltage in a non-volatile manner. For example, the threshold voltage Vt may be left unchanged (no flash back bias, no varying back bias is provided). Upon applying an appropriate back bias flash, i.e., a back bias voltage pulse, the threshold voltage may be shifted in a non-volatile manner. Additionally or alternatively, the back bias may be still tuned, irrespective of whether or not the semiconductor device has been flashed. Accordingly, the present disclosure allows for a non-volatile, as well as in situ tuning of the back bias of semiconductor devices via a flashing of a buried insulating multi-layer structure provided below the semiconductor device.

With regard to FIGS. 4a-4g, fabrication of a semiconductor device having a ferroelectric gate structure will be described in accordance with some illustrative embodiments of the present disclosure.

Figure 4A:
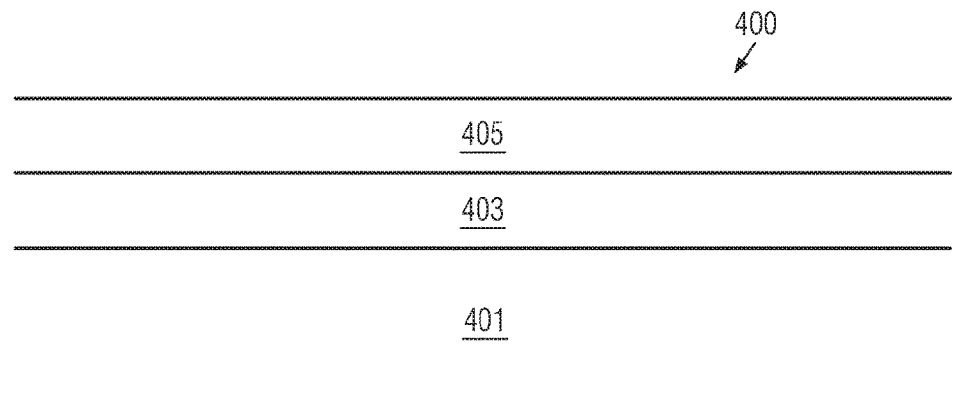
FIGS. 4a-4g schematically illustrate formation of a ferroelectric gate structure in accordance with some other illustrative embodiments of the present disclosure.

FIG. 4a schematically illustrates a semiconductor 400 at an early stage during fabrication, at which an SOI substrate configuration comprising a base substrate 401, a buried insulating material 403 and an active semiconductor material 405 is provided. The SOI substrate configuration as depicted in FIG. 4a may substantially correspond to an SOI configuration as described above.

Figure 4B:
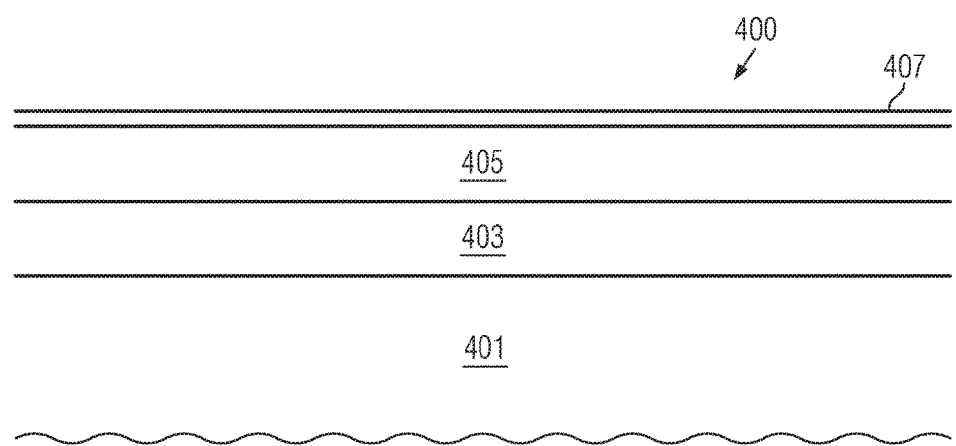

FIG. 4b schematically illustrates the semiconductor device structure 400 at a more advanced stage during fabrication, at which an optional dielectric liner 407 is deposited over the active semiconductor material 405, at least in an active region, a portion of which is schematically illustrated in FIGS. 4a-4g. In accordance with some illustrative examples herein, the dielectric liner 407 may comprise silicon oxide. In accordance with special illustrative examples herein, the gate dielectric liner 407 given by silicon oxide may be obtained due to a process of oxidation of the active semiconductor material 405 or by means of an oxide deposition process, such as TEOS and the like. This does not pose any limitations to the present disclosure and the person skilled in the art will appreciate that silicon nitride may be used instead of silicon oxide.

After a complete reading of the present disclosure, the person skilled in the art will appreciate that the dielectric liner 407 may be a passivation layer naturally formed on an exposed surface of the active semiconductor material 405 and/or may be removed prior to further processing as described below with regard to FIG. 4c and beyond. Accordingly, the dielectric liner 407 is optional and may be omitted during the fabrication process as described with regard to FIGS. 4a-4g. In the following, the dielectric liner 407 will be omitted from the further discussion and the person skilled in the art will appreciate that the dielectric liner 407 may be there, though not explicitly described, or may not be present, at least during the following processing.

Figure 4C:
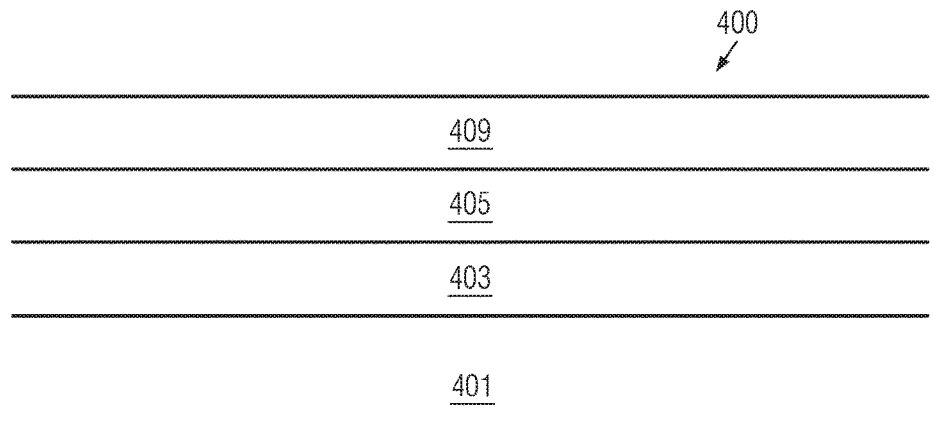

FIG. 4c schematically illustrates the semiconductor device 400 at a more advanced stage during fabrication, after a doped hafnium oxide material layer 409 may be formed on the active semiconductor material 405. In accordance with some illustrative embodiments of the present disclosure, the doped hafnium oxide material layer 409 may be deposited by means of atomic layer deposition (ALD) or physical vapor deposition (PVD). In accordance with some illustrative examples herein, the doped hafnium oxide material layer 409 may be doped with at least one of Si, Zr, Al, Y, La and Gd. In accordance with some special illustrative examples herein, 3-10 mol % of the dopants may be incorporated into the hafnium oxide material during or after its deposition.

The person skilled in the art will appreciate that, in accordance with some special illustrative examples, the deposited doped hafnium oxide material 409 may be in the amorphous phase at the stage depicted in FIG. 4c. For example, the amorphous state of the doped hafnium oxide material may be conserved until an appropriate annealing step (e.g., RTA) may be performed to induce the ferroelectric phase transition in the deposited doped hafnium oxide material at a later stage to be described below, therefore imposing limits on a thermal budget in these embodiments. For example, the deposition of the doped hafnium oxide material in an amorphous state may be within a temperature range of about 300-1200° C., such as in the range of about 400-1000° C. In accordance with special illustrative examples herein, a temperature range may be selected to be about 400-700° C. and/or about 600-700° C. and/or about 400-500° C. and/or about 500-600° C. and/or about 400-600° C.

In accordance with some alternative embodiments of the present disclosure, the hafnium oxide material layer 409 may be non-doped and may be formed by $HfO_2$. In accordance with some illustrative examples herein, the deposited non-doped $HfO_2$ layer 409 may have a thickness of less than 40 nm, e.g., 20 nm and below. In accordance with some special illustrative examples of the present alternative embodiments, the non-doped $HfO_2$ layer 409 may be deposited by RF sputtering in argon (Ar).

In accordance with still further alternative embodiments of the present disclosure, a non-doped hafnium oxide layer 409 may be formed on the active semiconductor material 405 and, subsequently, an implantation process (not illustrated) for implanting dopants comprising at least one of Si, Zr, Al, Y, La and Gd may be performed.

At the end of the stage as depicted in FIG. 4c, a doped hafnium oxide layer 409 may be disposed on the active semiconductor material 405, or a non-doped $HfO_2$ layer 409 may be disposed on the active semiconductor material 405.

Figure 4D:
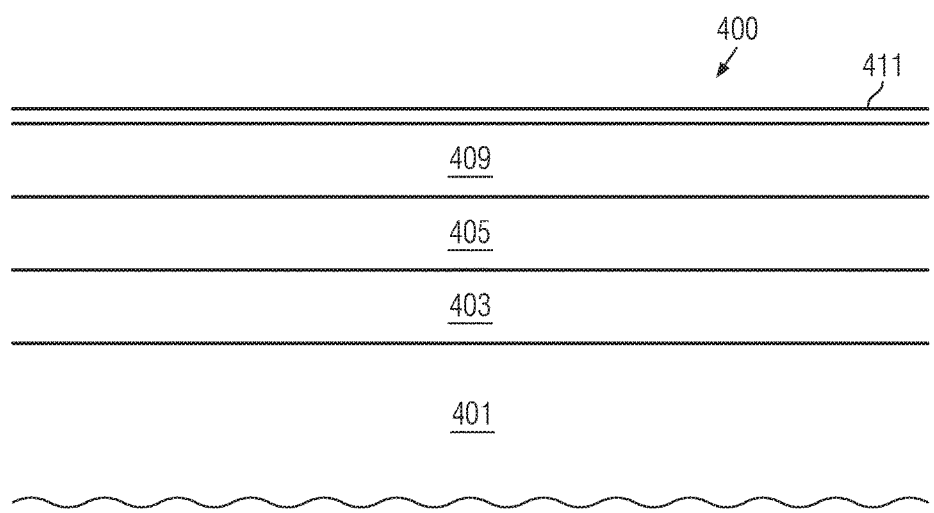

Referring to FIG. 4d, the semiconductor device 400 is schematically illustrated at a more advanced stage during fabrication, after an (optional) encapsulation layer 411 is deposited on the hafnium oxide material layer 409 (either doped or undoped). In accordance with some illustrative embodiments of the present disclosure, the (optional) encapsulation layer 411 may comprise TiN. Alternatively, a work function adjusting material may be deposited as known in the art. In accordance with some illustrative examples herein, the layer 411 may be deposited during RF sputtering.

Figure 4E:
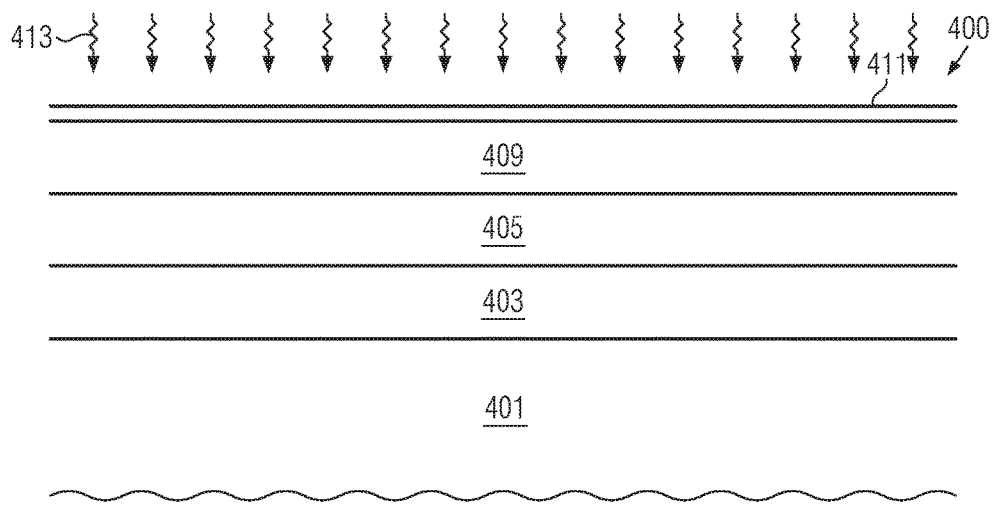

Referring to FIG. 4e, the semiconductor device 400 is schematically illustrated at a more advanced stage during fabrication, at which an annealing process 413 is performed. During the annealing process 413, the deposited hafnium oxide material layer 409 (either doped or undoped) may crystallize in the ferroelectric phase and a ferroelectric hafnium oxide material layer may be formed. In accordance with some special illustrative examples, the annealing step may comprise exposing the semiconductor device 400 to a temperature of about 600° C. for 30 seconds in an $N_2$ environment. Alternatively, the annealing step may comprise exposing the semiconductor device 400 to a temperature of about 500° C. for 30 seconds in an $N_2$ environment. Alternatively, annealing temperatures may be chosen to be about 550° C., about 650° C. and about 750° C. Generally, annealing temperatures may be in an illustrative range between about 500-750° C. However, this does not pose any limitation in the present disclosure and the person skilled in the art will appreciate that annealing temperatures from about 300-1200° C. for an appropriate time interval are possible.

Figure 4F:
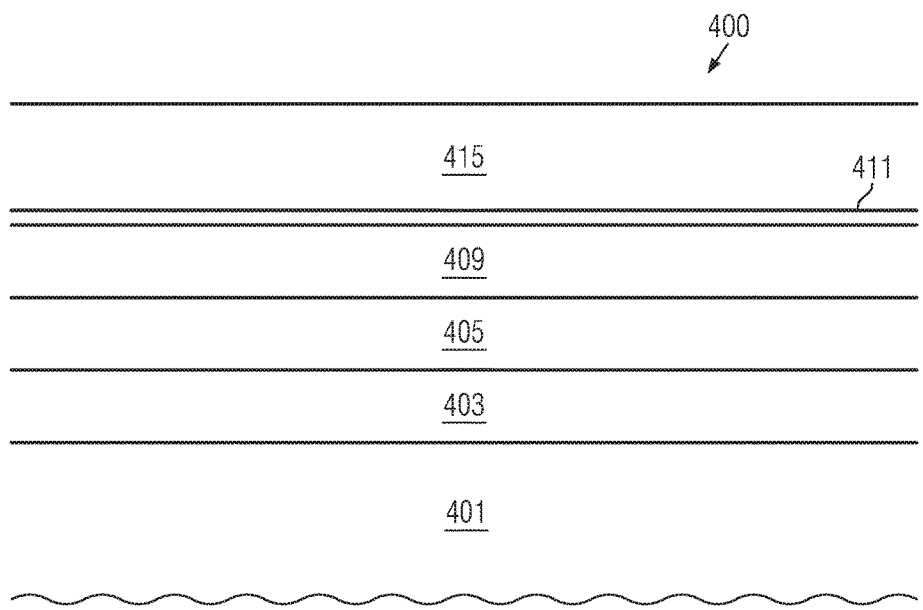

Referring to FIG. 4f, the semiconductor device 400 is schematically illustrated at a more advanced stage during fabrication, after a gate electrode material 415 is formed over the ferroelectric hafnium oxide material layer 409. In accordance with some illustrative embodiments of the present disclosure, the gate electrode material 415 may be one of polysilicon, amorphous silicon and an appropriate electrode metal known in the art.

Figure 4G:
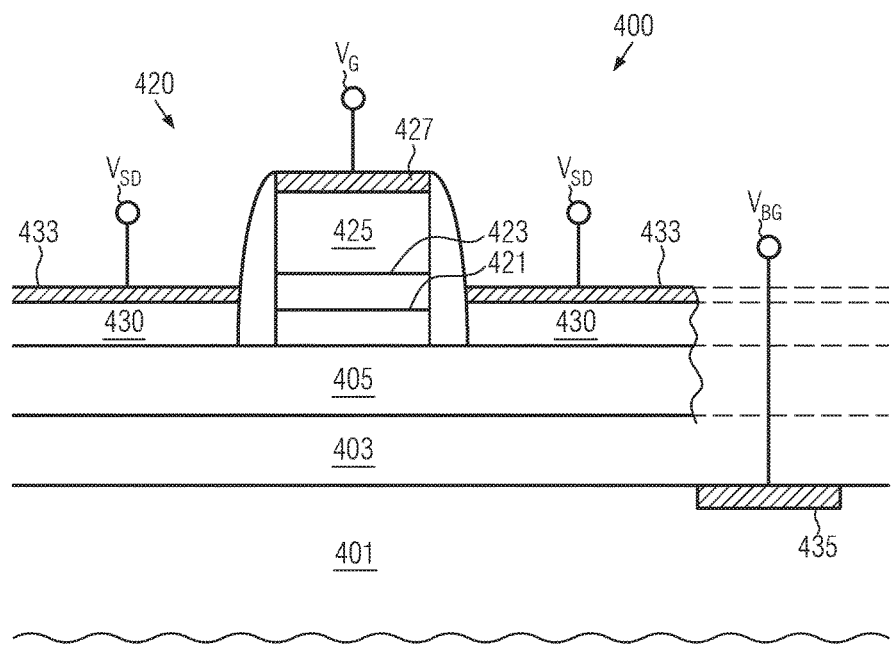

Regarding FIG. 4g, the semiconductor device 400 is schematically illustrated at a more advanced stage during fabrication, at a late phase during or after front-end-of-line (FEOL) processing. For example, the gate structure 420 may be obtained by patterning the layer stack in FIG. 4f in accordance with known gate forming techniques. The ferroelectric gate structure 420 comprises a ferroelectric gate dielectric 421 (optionally including a silicon oxide liner formed between the ferroelectric hafnium oxide material layer (409 in FIG. 4f) and an upper surface of the active semiconductor material 405. On the gate dielectric 421, a work function adjusting material 420, e.g., TiN, may be formed, on which in turn a gate electrode 425 is disposed. The gate electrode 425 is contacted by means of a silicide contact 427. In alignment with the gate structure 420, raised source/drain regions 430 may be formed at opposing sides of the gate structure 420, the raised source/drain regions 430 being contacted by means of silicide contacts 433.

FIG. 4g schematically illustrates a further contact structure 435 provided for contacting a contact region (not particularly indicated in FIG. 4g) for applying a back bias to the gate structure 420, as described above with regard to FIGS. 1 and 3. In accordance with some illustrative examples of the present disclosure, the contact structure 435 may be provided by means of a so-called bulk exposed (BULEX) region in which the active semiconductor material 405 and the buried insulating material 403 are removed to expose an upper surface portion of the base substrate 401.

In accordance with some illustrative embodiments of the present disclosure, the semiconductor device 400 may be operated by applying a reference voltage level Vref to the source/drain regions, that is $V_{SD}$ coupled to the silicide contacts 433 is equal to Vref. Furthermore, the gate voltage $V_G$ is brought to a voltage level V2, and a back bias voltage level V3 is applied to the contact region below the ferroelectric gate structure 420 via the silicide contact 435 upon selecting $V_{BG}$ equal to V3. Accordingly, the ferroelectric material of the ferroelectric gate structure 420 may be exposed to an electric field caused by a voltage drop equal to abs (V2)+abs (V3), wherein V2>Vref and V3<Vref. In accordance with some special illustrative examples herein, V2 may be equal to +2 volts, while V3 may be equal to −3 volts. Accordingly, a voltage drop of +5 volt may be applied as a programming voltage to the ferroelectric gate dielectric of the ferroelectric gate structure 420.

After a complete reading of the present disclosure, the person skilled in the art will appreciate that no dedicated high voltage devices are required for programming NVM devices. Accordingly, standard IO devices can be used. Furthermore, lower electrical fields may be used in the gate and spacer region of NVM devices when programming these devices, therefore, causing less stress and leading to high reliability of NVM devices.

In accordance with some illustrative embodiments of the present disclosure, a fabrication of a ferroelectric semiconductor device on an SOI substrate configuration is described, wherein a back bias of the semiconductor device during programming/erasing of the memory of the semiconductor device may be applied. Due to the applied back bias, the total voltage may be split into two voltage parts, one at the gate and one at the body/substrate of the SOI substrate configuration, resulting in a required electrical field in the ferroelectric high-k material of a ferroelectric gate structure used for programming/erasing the ferroelectric high-k material without the need of dedicated high voltage devices.

In various embodiments of the present disclosure, the access voltage for NVM devices, being in the range of about 5 volts, for a proper programming/erasing of a bit cell, may be lowered to lower absolute values. Accordingly, NVM devices with low access voltage employing SOI substrate configurations are provided.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:
1. A semiconductor device, comprising:
a substrate structure comprising an active semiconductor material formed over a base substrate and a buried insulating material formed between said active semiconductor material and said base substrate;
a ferroelectric gate structure disposed over said active semiconductor material in an active region of said substrate structure, said ferroelectric gate structure comprising a gate electrode and a ferroelectric material layer;
a contact region formed in said base substrate under said ferroelectric gate structure; and
a contact structure contacting said contact region, said contact structure extending through said buried insulating material adjacent to said ferroelectric gate structure.
2. The semiconductor device of claim 1, wherein said contact region is a well region formed in said base substrate.
3. The semiconductor device of claim 2, wherein said well region is an N-well, said base substrate having at least one P-well region laterally enclosing said N-well.
4. The semiconductor device of claim 1, wherein said contact structure extends through said buried insulating material at a location outside said active region.
5. The semiconductor device of claim 1, wherein said active region is laterally enclosed by an isolation structure.
6. The semiconductor device of claim 1, wherein said ferroelectric material layer is formed by a ferroelectric high-k material.
7. The semiconductor device of claim 6, wherein said ferroelectric high-k material comprises a hafnium oxide material.
8. The semiconductor device of claim 6, wherein said ferroelectric high-k material is Si:HfO2.
9. A method, comprising:
forming a ferroelectric gate structure comprising a gate electrode and a ferroelectric material layer over an active region of a substrate structure, said substrate structure comprising an active semiconductor material formed over a base substrate and a buried insulating material formed between said active semiconductor material and said base substrate;
forming a contact region in said base substrate under said ferroelectric gate structure; and
exposing a portion of said base substrate in said active region, wherein exposing said portion of said base substrate comprises removing a portion of said active semiconductor material and said buried insulating material in said active region such that said portion of said base substrate is exposed, said portion of said base substrate being electrically coupled to said contact region.
10. The method of claim 9, wherein forming said ferroelectric gate structure comprises forming said ferroelectric material layer and forming said gate electrode over said ferroelectric material layer.
11. The method of claim 10, wherein forming said ferroelectric material layer comprises depositing a hafnium oxide material layer over said active region and implanting at least one of silicon (Si), zirconium (Zr), lanthanum (La), aluminum (Al) and gadolinium (Gd) into said hafnium oxide material layer.
12. The method of claim 10, wherein forming said ferroelectric material layer comprises depositing a hafnium oxide material layer doped with at least one of silicon (Si), zirconium (Zr), aluminum (Al), yttrium (Y), lanthanum (La) and gadolinium (Gd) by means of one of an atomic layer deposition (ALD) process and a physical vapor deposition (PVD) process over said active region, and forming a titanium nitride (TiN) layer on said deposited hafnium oxide material layer prior to forming said gate electrode.
13. The method of claim 12, further comprising an anneal step after said TiN layer is formed, said anneal step comprising applying a temperature out of a range from about 300-1200° C.
14. The method of claim 9, wherein an isolation structure is formed in said substrate structure, said isolation structure extending through said active semiconductor material and laterally enclosing said active region.
15. The method of claim 9, further comprising forming a contact structure over said portion of said base substrate.
16. The method of claim 9, wherein forming said contact region comprises implanting dopants into said base substrate in said active region, wherein a well region is formed in said base substrate under said ferroelectric gate structure.
17. A method of operating a semiconductor device, said semiconductor device comprising a substrate structure comprising an active semiconductor material formed over a base substrate and a buried insulating material formed between said active semiconductor material and said base substrate, a ferroelectric gate structure disposed over said active semiconductor material in an active region of said substrate structure, said ferroelectric gate structure comprising a gate electrode and a ferroelectric material layer, source/drain regions formed in said active region in alignment with said ferroelectric gate structure, and a contact region formed in said base substrate under said ferroelectric gate structure, the method comprising:

applying a reference voltage level Vref to said source/drain regions; and exposing said ferroelectric material layer to an access voltage drop V1;

wherein exposing said ferroelectric material to said access voltage V1 comprises:

applying a gate voltage level V2>Vref to said gate electrode; and applying a back bias voltage level V3<Vref to said contact region;

wherein V1=abs(V2)+abs(V3).

18. The method of claim 17, wherein V2=2 V, V3=−3 V and Vref=0.

* * * * *